(12) United States Patent
Lundquist et al.

(10) Patent No.: US 7,589,889 B2
(45) Date of Patent: Sep. 15, 2009

(54) TRANSIENT OPTICAL POWER SUPPRESSING APPARATUS, METHOD, AND NETWORK

(75) Inventors: Paul Lundquist, San Jose, CA (US); Marc Levesque, San Jose, CA (US); Denis Zaccarin, San Jose, CA (US)

(73) Assignee: Ciena Corporation, Linthicum, MD (US)

( * ) Notice: Subject to any disclaimer, the term of this patent is extended or adjusted under 35 U.S.C. 154(b) by 0 days.

(21) Appl. No.: 12/174,351

(22) Filed: Jul. 16, 2008

(65) Prior Publication Data

US 2008/0273876 A1    Nov. 6, 2008

Related U.S. Application Data

(62) Division of application No. 10/855,385, filed on May 28, 2004, now Pat. No. 7,483,205.

(60) Provisional application No. 60/500,241, filed on Sep. 5, 2003, provisional application No. 60/473,917, filed on May 29, 2003.

(51) Int. Cl.
*H04B 10/17* (2006.01)
*G02B 6/26* (2006.01)

(52) U.S. Cl. .................................. 359/341.3

(58) Field of Classification Search ............... 359/341.3
See application file for complete search history.

(56) References Cited

U.S. PATENT DOCUMENTS

| | | | |
|---|---|---|---|
| 5,923,462 A | 7/1999 | Van Der Plaats | |
| 6,038,063 A | 3/2000 | Tsuda et al. | |
| 6,163,399 A | 12/2000 | Berg | |
| 6,198,571 B1 | 3/2001 | Yang | |
| 6,271,945 B1 | 8/2001 | Terahara | |
| 6,320,692 B1 | 11/2001 | Notargiacomo | |
| 6,341,034 B1 | 1/2002 | Sun et al. | |
| 6,342,959 B1 | 1/2002 | Haxell et al. | |

(Continued)

OTHER PUBLICATIONS

Hayee et al., "Transmission penalties due to EDFA gain transients in add-drop multiplexed WDM networks", IEEE Photonics Technology Letters, vol. 11, No. 7, Jul. 1999, 889-891.

(Continued)

*Primary Examiner*—Eric Bolda
*Assistant Examiner*—Ari M Diacou
(74) *Attorney, Agent, or Firm*—Clements Bernard PLLC; Christopher L. Bernard; Tyler S. Brown

(57) ABSTRACT

An apparatus for suppressing optical power transients includes a variable optical attenuator receiving an input optical signal and outputting an output optical signal; an optical power sensing element coupled to the input optical signal and sensing a portion of the input optical signal; and a feedforward loop controller coupled to the variable optical attenuator and to the optical power sensing element; the feedforward control loop providing feedforward control of the variable optical attenuator to reduce optical power transients of the input optical signal and maintain a substantially constant output power based on the input optical power and a reference value; the variable optical attenuator having a default opaque state in which the input optical signal is substantially attenuated when power is not being supplied to said variable optical attenuator. Variations include feedback loop controllers and a combination feedback and feedforward loop controllers.

9 Claims, 18 Drawing Sheets

U.S. PATENT DOCUMENTS

| | | | |
|---|---|---|---|
| 6,363,203 | B1 | 3/2002 | Dautartas |
| 6,396,327 | B1 | 5/2002 | Lam |
| 6,407,854 | B1 | 6/2002 | Shum |
| 6,414,788 | B1 | 7/2002 | Ye et al. |
| 6,441,950 | B1 | 8/2002 | Chen et al. |
| 6,466,349 | B1 | 10/2002 | Valley et al. |
| 6,476,961 | B1 | 11/2002 | Ye et al. |
| 6,483,632 | B1 * | 11/2002 | Jolley et al. ............. 359/337.4 |
| 6,496,300 | B2 | 12/2002 | Kinoshita et al. |
| 6,529,319 | B2 | 3/2003 | Youn et al. |
| 6,535,330 | B1 | 3/2003 | Lelic et al. |
| 6,560,008 | B1 | 5/2003 | Wada |
| 6,674,563 | B2 | 1/2004 | Chui et al. |
| 6,687,045 | B2 | 2/2004 | Lelic et al. |
| 6,690,506 | B2 | 2/2004 | Zahnley et al. |
| 6,690,508 | B2 | 2/2004 | Tian et al. |
| 6,757,099 | B2 | 6/2004 | Pavel et al. |
| 6,943,937 | B2 | 9/2005 | Lelic et al. |
| 7,068,423 | B2 | 6/2006 | Vella et al. |
| 7,266,264 | B2 | 9/2007 | Nakamoto et al. |
| 2002/0136525 | A1 | 9/2002 | He |
| 2003/0035203 | A1 | 2/2003 | Shlifer et al. |
| 2003/0086153 | A1 * | 5/2003 | Mandelbaum et al. ... 359/337.1 |
| 2003/0184851 | A1 * | 10/2003 | Tian et al. ................ 359/341.4 |

OTHER PUBLICATIONS

Tomkos et al., "Transport performance of an 80-Gb/s WDM regional area transparent ring network utilizing directly modulated lasers," Journal of Lightwave Technology, vol. 20, No. 4, Apr. 2002, 562-573.

Park et al., "Dynamic gain and output power control in gain-flattened erbium-doped fiber amplifier", IEEE Photonics Technology Letters, vol. 10, No. 6, Jun. 1998, 787-789.

Sun et al., " Fast power transients in WDM optical networks with cascaded EDFAs", Electronics Letters, vol. 33, No. 4, Feb. 13, 1997.

Eric J. Newman, Matthew Pilotte, Closed-Loop Control of Variable Optical Attenuators with Logarithmic Analog Processing. Analog Dialogue 37-12, Dec. 2003. http://www.analog.com/analogdialogue pp. 1-5.

* cited by examiner

TRANSIENT OPTICAL POWER SUPPRESSING APPARATUS, METHOD, AND NETWORK

This application is a divisional of U.S. patent application Ser. No. 10/855,385, filed on May 28, 2004, now U.S. Pat. No. 7,483,205, which claims priority on Provisional Patent Application No.(s). 60/500,241, filed on Sep. 5, 2003 and 60/473,917, filed on May 29, 2003, the entire contents of which are hereby incorporated by reference.

BACKGROUND OF THE INVENTION

1. Field of Invention

The invention generally relates to methods and apparatuses for controlling or otherwise suppressing transients and their applications to various optical communication networks.

2. Description of Related Art

Optical WDM (wavelength division multiplexed) and other types of optical transmission systems are becoming increasingly dynamic. For example, there is a greater emphasis on dynamic add/drop architectures, protection switching, and traffic rerouting all of which can introduce unwanted optical power transients. In such systems, optical power transients may also be introduced by various other factors such as routine system activities and unintended events such as fiber cuts and equipment failures. Once an optical power transient is created it is often exacerbated by optical amplifiers and other active optical devices.

The performance of the optical transmission system can be adversely affected particularly by fast power transients, beyond the effects of the temporary change in the power level at the receiver. Both the magnitude and temporal characteristics of the optical power transients that occur can limit the performance of various elements such as optical receivers and amplifiers in the system. While component designers continue to improve the transient performance of individual sources, a comprehensive strategy for suppressing the power transients that exist in these systems offers improved system design flexibility and coincident cost savings.

Rapid changes in optical power levels occur routinely in transmission systems. Reconfigurable optical add/drop architectures are designed to accommodate changing levels in the total optical power present in a given fiber or at the input to various optical components but these accommodations are often insufficient.

Other sources of optical power transients include optical protection switching mechanisms that can lead to changes in the optical power level on the order of the speed of opto-mechanical switches, typically 100 to 200 μsec. Fiber cut events can be faster, reaching a few 10ths of μs. System upgrades and maintenance often require changes in power levels that give rise to optical power transients.

Even a small optical power change from any of these sources can be exacerbated by constant gain amplifiers such as constant gain erbium-doped fiber amplifiers (EDFAs) particularly if the time scale is similar to the time response of the EDFA control loop. The effects would be even worse for optical amplifiers operated in constant power mode. The ultimate power transient after a cascade of EDFAs can be particularly problematic. FIG. 15 shows one example of a conventional optical network configuration where one WDM channel is added at Node 1, and a second WDM channel is added at Node 2. If the fiber between Nodes 1 and 2 is cut, EDFA #3 will experience a rapid 3 dB change (in situations where both signals have the same optical power) in its input power level, and the actual gain of EDFA #3 may experience a brief excursion from its target value due to the finite response time of its control loop.

Similarly, equipment failure or active optical components can introduce sudden changes in the input power at an optical amplifier. An example of the effect of a simulated fiber cut (optical transition time 200 μsec) at the beginning of a cascade of 10 EDFAs is shown in FIG. 16. In this case there are two optical channels present at the input of the cascade (EDFA #2 in FIG. 1), and one of these is switched off to simulate a fiber cut. The change in input power at the first EDFA is 3 dB, and if the EDFA control loop is capable of maintaining constant gain the second channel would be unaffected. However, the small transient (0.5 dB) observed at the output of the first EDFA induces a much larger transient (5 dB) at the output of the tenth amplifier. The performance of the EDFAs is limited by both the fundamental Erbium dynamics and the design and implementation of the EDFA control loop, which has a finite response time. In addition to the temporary power transient, the difference between the initial and final steady-state power levels increases throughout the cascade, due to the input power dependence of the gain accuracy of each EDFA.

The above are non-limiting examples of the situations in which optical power transients arise and how they may be exacerbated. It is to be understood that many other examples and situations exist.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF INVENTION

Figure 1:
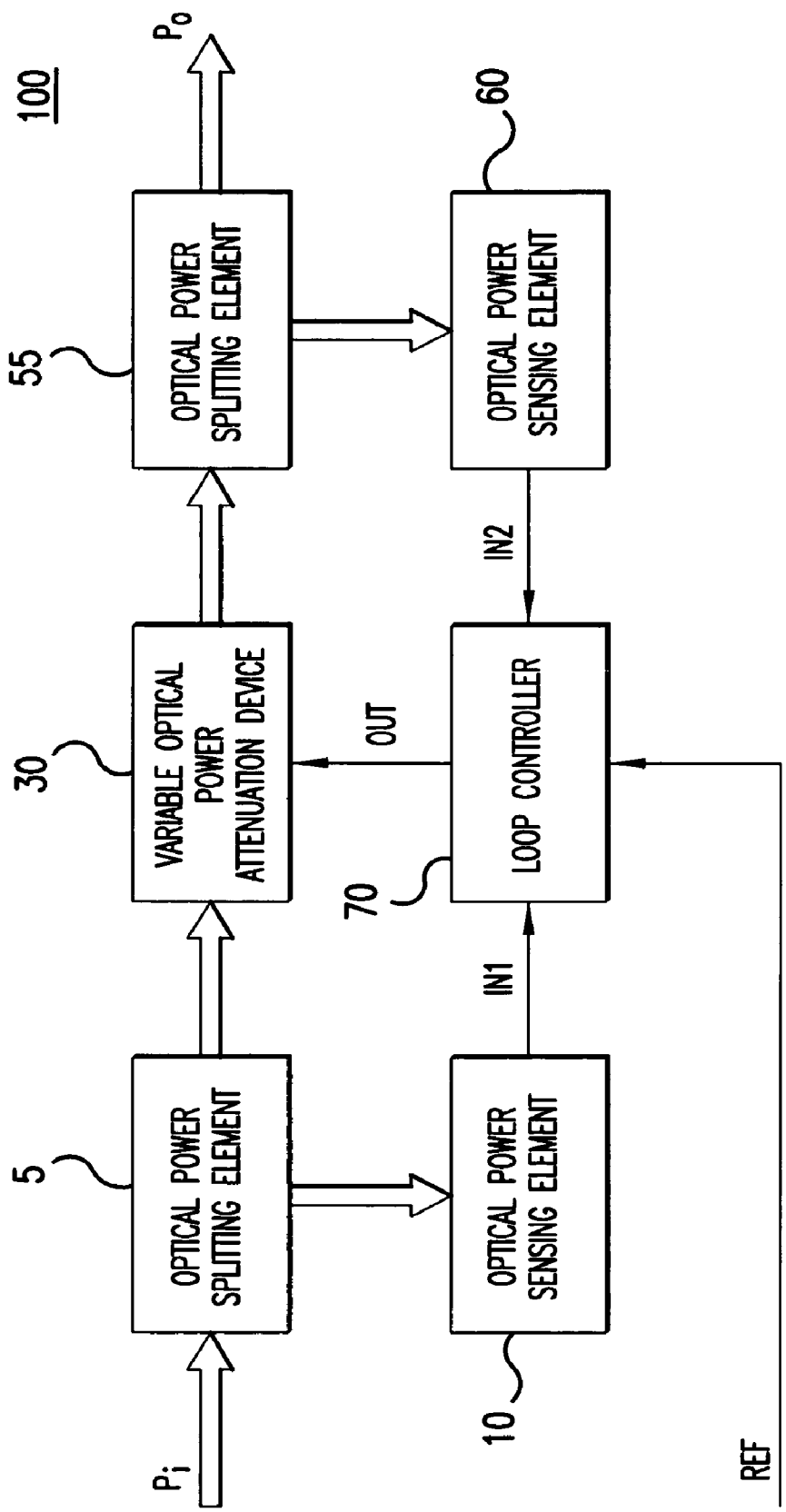
FIG. 1 is a high level block diagram of a transient optical power suppressor according to a first embodiment of the invention and including both a feedforward control loop and feedback control loop.

The following detailed description of the invention refers to the accompanying drawings. The same reference numbers in different drawings identify the same or similar elements. Also, the following detailed description does not limit the invention. Instead, the scope of the invention is defined by the appended claims and equivalents thereof.

The expression "optically communicates" as used herein refers to any connection, coupling, link or the like by which optical signals carried by one optical system element are imparted to the "communicating" element. Such "optically communicating" devices are not necessarily directly connected to one another and may be separated by intermediate optical components or devices. Likewise, the expressions "connection" and "operative connection" as used herein are relative terms and do not require a direct physical connection.

Optical power transients are described by two general features; the relative magnitude of the power excursion from the steady-state level and the time scale (temporal characteristics) of the transition in optical power. For gaussian pulses or step-function changes, it is appropriate to consider the rise-time and/or fall-time of the change in optical power level. The evolution of a transient pulse in a cascade of amplifiers such as EDFA's will be governed largely by the speed and the amplitude of the transient, although other factors including any change in spectral loading and initial EDFA operating conditions are often important.

One apparent impact of positive optical power spikes is the potential for damage to optical receivers and other components. The damage threshold of most optical components has a peak-power (electronic damage) component and an average power (thermal damage) component. The susceptibility to damage is therefore a function of both the speed and amplitude of positive power transients.

A second consideration is data integrity, which is limited by the sensitivity of the detection circuit to changes in average optical power. The effects of the power transients at the receiver also have both a speed component and an amplitude component. The amplitude is important for several reasons. The most apparent is the fact that the detection circuitry is typically designed to operate within a particular range of average optical power levels, and a power transient of sufficient amplitude will result in a closure of the eye diagram and degraded system performance. Often optical power levels are configured to maximize OSNR (optical signal-to-noise ratio) at the receiver, and the arrangement of optical amplifiers and other components is typically selected with this in mind, but a temporary change in the power level is likely to result in a degraded OSNR at some locations.

Some system designs are limited by nonlinear effects that result in restrictions to the allowable launch power into a fiber, and positive power transients will temporarily perturb these levels and result in worsened nonlinear effects. The speed of fluctuations in average power can also lead to data errors. The receiver circuitry should be designed to respond to data rate frequencies while also allowing for slower drifts in average power. If the speed of an unintended optical power transient falls in between these two limits, data errors may result. These and other factors argue that an overall reduction in the magnitudes and speeds of optical power transients can lead to improved system performance.

FIG. 1 illustrates an apparatus 100 for suppressing optical power transients according to an embodiment of the invention. This apparatus 100 is also referred to as a transient optical power suppressor and FIG. 1 illustrates a first embodiment thereof.

Essentially, the transient optical power suppressor 100 illustrated therein has an input optical signal having an input optical power $P_i$. The output of apparatus 100 is another optical signal whose transient optical power fluctuations have been suppressed. The optical power of the output signal is labeled as $P_o$ and may otherwise be referred to as the optical output power.

The input optical signal may be any optical signal and the invention has broad applicability to reducing optical power transients in a wide variety of optical signals. The invention does have particular and advantageous application to dynamic optical transmission systems having a plurality of optical channels. Such dynamic transmission systems are, in and of themselves, quite common and include such technologies as wavelength division multiplexing (WDM) and reconfigurable add/drop multiplexing as well as other channel multiplexing techniques such as polarization state, sub carrier multiplexing, code division multiplexing, etc.

Furthermore, the invention is insensitive to data rate, data format, analog or digital signals, actual wavelength or frequency of the data, number of transmission channels present, channel spacing, and various factors as the various embodiments of the invention seek to control only the transient optical power fluctuations which are independent of such factors.

The transient optical power suppressor 100 shown in FIG. 1 includes two control loops: a feedforward control loop including optical power splitting element 5, optical power sensing element 10, loop controller 70, and variable optical power attenuation device 30. The second control loop is a feedback control loop which includes optical power splitting element 55, optical power sensing element 60, loop controller 70, and optical power attenuation device 30.

While it is possible to provide a separate loop controller and variable optical power attenuation device for each of the control loops such duplication of parts is unnecessary, especially for a digital implementation. Only one optical power attenuation device 30 is preferably used between the feedforward and feedback control loops. A single variable optical power attenuation device 30 should be sufficient to control all expected power fluctuations and supplying a second variable optical power attenuation device may introduce unwanted system penalties such as additional insertion loss.

On the other hand, there is a technical reason for using multiple VOAs that could outweigh these factors: namely, the limited dynamic range of one VOA such that a different VOA could be used for feedback than for feedforward control. Also, one high speed VOA could be used together with a slow speed VOA with one latching for the other. Two (or even more) VOAs may also be advantageous for expanded dynamic range.

In more detail, the transient optical power suppressor 100 shown in FIG. 1 includes optical pathways indicated by large arrows and electrical pathways indicated by smaller, single line arrows. The optical pathways may be provided via optical fiber links that may be optically spliced to the other elements or connected via standard connectorization methods. Alternatively, the optical components could be integrated into one or more substrates. It is also possible that all of the components shown in FIG. 1 could be integrated into a single substrate.

For example flip chip techniques have been used to put PIN or APD devices on the same substrate as other optical devices such as couplers, taps as required here. VOA technologies required for suppression of transients discussed here lend themselves to integration with passive taps and couplers on the same substrate. The loop filter is likely to be a separate chip with current technology but perhaps could be integrated with the other components in the future.

Devices have been constructed integrating all of the optical components employed by the invention (fast VOAs, optical power taps and PINs) onto a single Si chip already. All of the chips used in the control loop are very often fabricated on Si, so it is straightforward to integrate these together with the optical components on one chip. However, such an implementation would be less attractive if the expected volume is low or if compactness and ease of manufacture are not critical issues, at least with current manufacturing techniques in this area. VOA technologies required for suppression of transients discussed here led themselves to integration with passive taps and couplers on the same substrate.

As further shown in FIG. 1, the optical input signal whose power is represented by $P_i$ is split by an optical power splitting element 5 which splits the optical signal such that a major portion thereof is supplied to the variable optical power attenuation device 30 and a smaller portion thereof is supplied to the optical power sensing element 10. Likewise, the optical power splitting element 55 splits the optical signal output from the optical power attenuation device 30 and supplies a major portion thereof to the output port having output power $P_O$ and a much smaller portion thereof which is supplied to the optical power sensing element 60. The splitting or tap ratio of the optical power splitting elements 5, 55 is generally selected to supply power sufficient for the sensing elements 10, 60 while preserving most of the power for the main signal pathway. Such optical power splitting elements 5, 55 are very conventional and may be constructed utilizing various devices such as couplers or taps.

The optical power sensing elements 10, 60 may be constructed with conventional PIN photodetectors, avalanche photodetectors (APDs) or equivalent elements. Such power sensing elements are highly conventional in and of themselves.

In the feedforward control loop, the optical power sensing element 10 senses a portion of the input optical signal and outputs a signal indicative of the power $P_i$ of the input optical signal. This signal IN1 is indicative of the input optical power and is supplied to the loop controller 70 as shown. In the feedback control loop, the optical power sensing element 60 senses a portion of the output optical signal in order to measure power of that signal and outputs an electric signal IN2 indicative of the power of the output optical signal. This electrical signal IN2 is supplied to the loop controller 70 as shown.

Figure 4A:
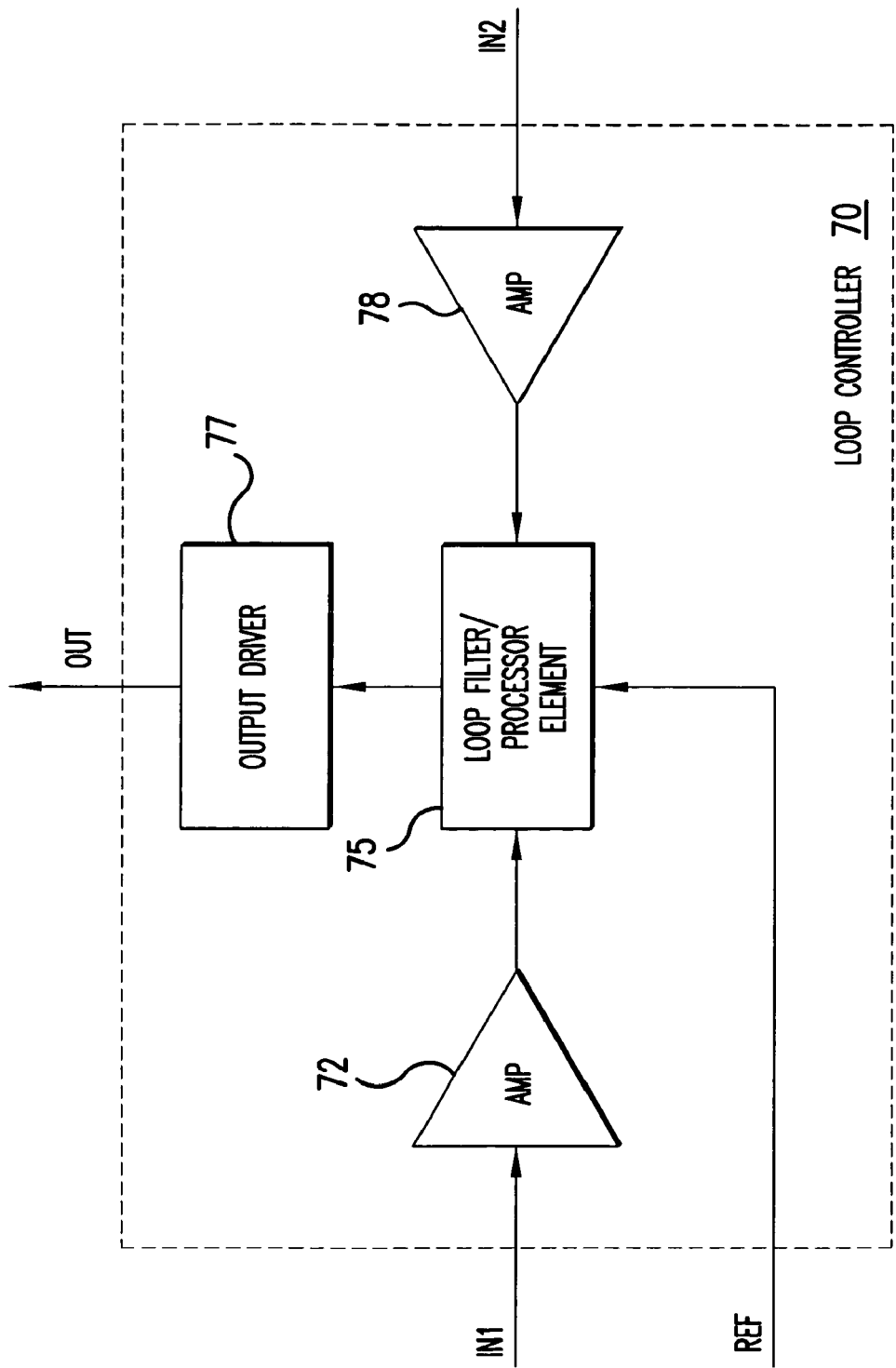
FIG. 4a is a block diagram illustrating a construction of a loop controller according to the invention and usable with the first embodiment of the invention.
Figure 5:
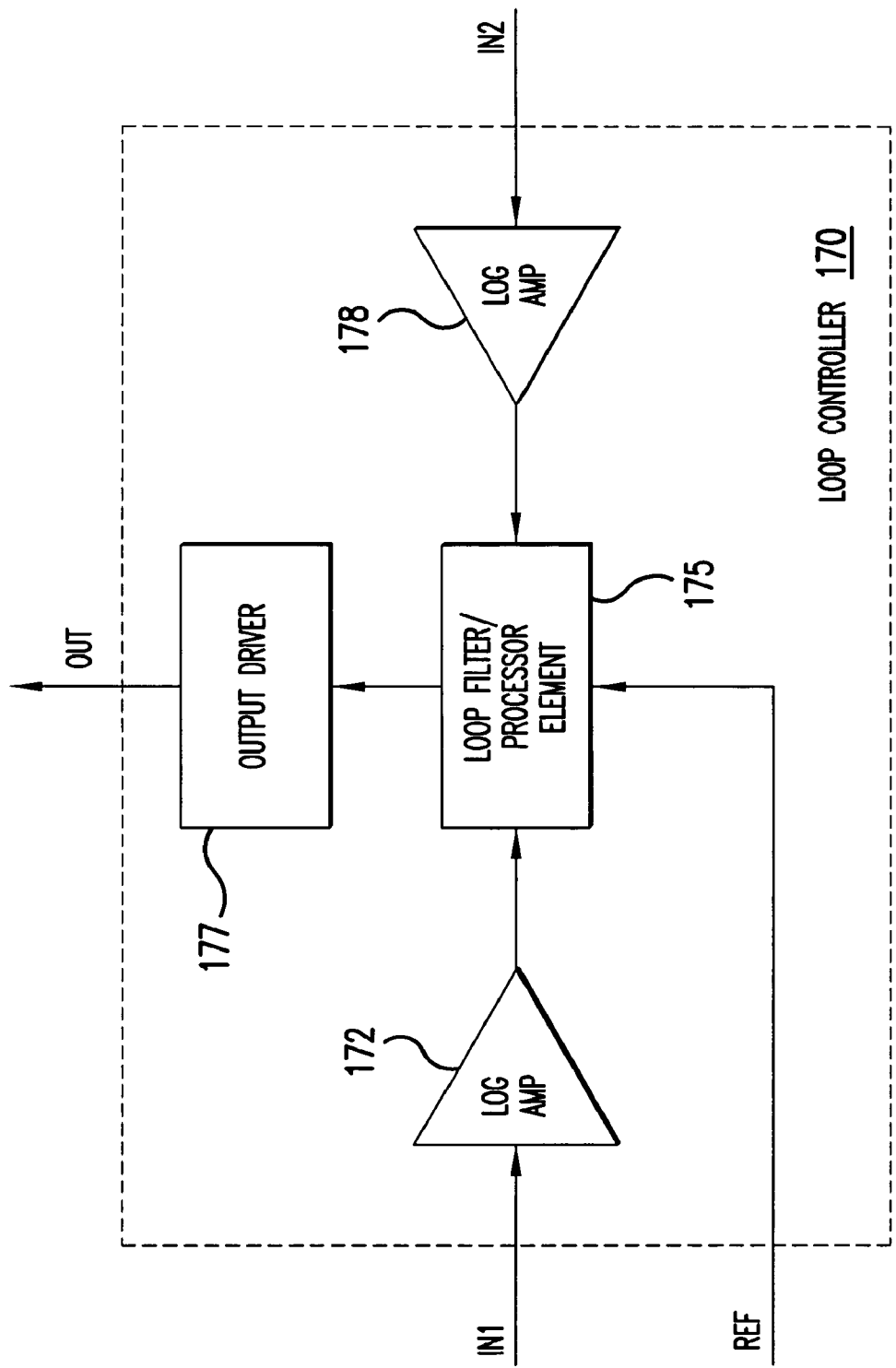
FIG. 5 is a block diagram of an alternative loop controller utilizing logarithmic amplifiers according to the invention and illustrating principles usable with all the embodiments of the invention.

The loop controller 70 is a shared controller that controls both the feedforward and feedback control loop operations. The loop controller 70 may be constructed with a variety of devices an example of which is shown in FIG. 4a and another example of which is shown in FIG. 5. Further details of the loop controller 70 will be explained with reference to those figures below.

The loop controller 70 has electrical connections to the optical power sensing elements 10, 60 and accepts the optical power measurement signals IN1, IN2 representative of the optical power of the input and output optical signals, respectively. The loop controller 70 may also accept as input a reference value (REF) which may simply be a voltage value externally supplied or internally stored within the loop controller 70 itself. The reference value provides a basis against which the loop controller may control the variable optical power attenuation device 30 so as to output a substantially constant power optical signal output $P_O$. Further details of the operation of the loop controller 70 are provided below. The control signal provided by loop controller 70 is labeled as OUT and is supplied to the variable optical attenuation device (VOA) 30.

The variable optical power attenuation device 30 may be constructed from a variety of devices such as a Mach Zehnder (MZ) optical modulator, or various other devices. Since the speed of this device 30 is a critical component of the invention, technologies such as the current-injection VOA are generally preferred because of their fast response time. As the technology develops and other competing VOA technologies develop that have response times on the order of the current-injection VOA technology, then such future technologies would be preferred assuming that costs and reliability and other factors are relatively equal.

Because the overall inventive aim is to suppress optical power transients and because such transients have a time scale that can be extremely short, it is important to utilize a variable optical power attenuation device 30 that has a fast response time. The preferred technology chosen is a current-injection variable optical attenuator (current injection VOA). Attenuation of this type of device is roughly proportional to drive current which is shown as the OUT or control signal from the loop controller 70.

The frequency responses of the current-injection VOA and its drive circuit can be described as $$\frac{P_{out}}{I_{VOA}}(f) \text{ and } \frac{I_{VOA}}{V_{in}}(f)$$

respectively, where $P_{out}$ is the optical power measured at the VOA output ($P_0$ in FIG. 1), $I_{VOA}$ is the drive current (OUT in FIG. 1), and $V_{in}$ is the reference voltage at the comparator (REF in FIG. 1).

The current-Injection VOA technology provides the fastest response time currently available from commercial VOA devices, and response time is critical for this invention. The device is typically based on a Si substrate, in order to leverage the vast amount of technological expertise and processing equipment that are based on Si thin film devices. The device includes one or more optical waveguides, which can be fabricated from Si or SiO2 layers that are deposited onto the substrate and then patterned into channel waveguides. A cathode and anode are situated above and below a segment of the waveguide, and electrical current is passed through either the guide region itself or the cladding region adjacent to the guide. The materials are selected such that the electrons or holes injected are efficiently absorbed by photons propagating in the guide (and partially in the cladding modes as well) and the light is thus absorbed and converted into thermal energy. The degree of attenuation will vary with the amount of electrical current injected. The process is extremely fast, limited mainly by the electronic properties of the current source and the impedance properties of the materials involved. Typically response times of less than one microsecond are achievable using this technology.

Returning to FIG. 1, the variable optical power attenuation device 30 is the main active element that acts upon the input optical signal in order to suppress or otherwise reduce transient optical power fluctuations under the control of the loop controller 70. The transient-reduced optical signal having output power $P_0$ is output from the apparatus 100. Operational details are supplied below.

Figure 2:
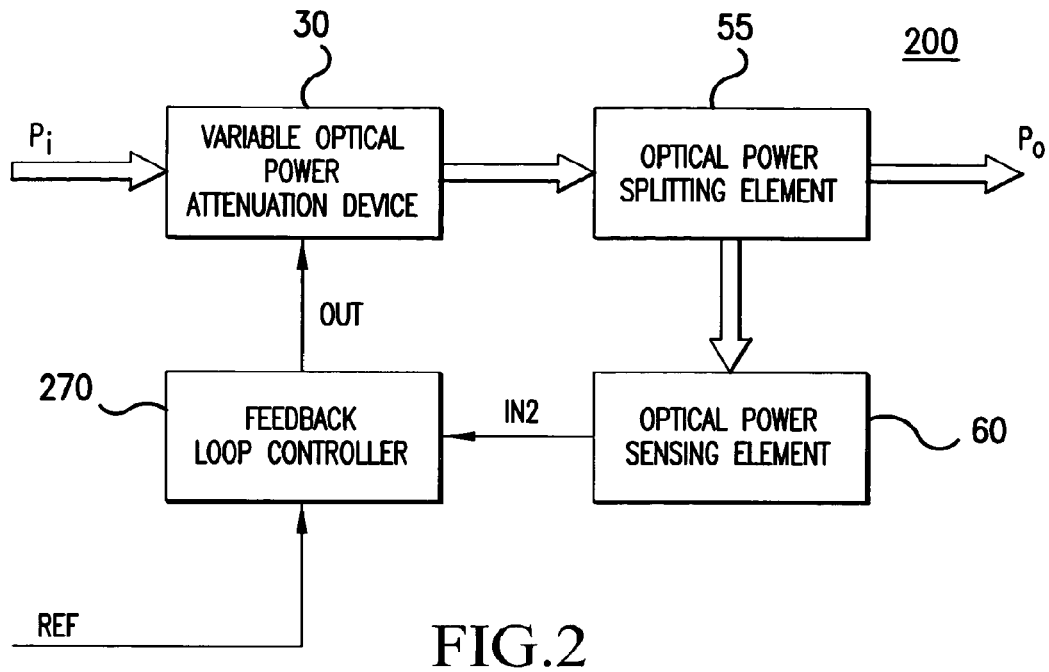
FIG. 2 is a high level block diagram of another transient optical power suppressor according to a second embodiment of the invention and including a feedback control loop.

FIG. 2 illustrates another embodiment of the invention and is essentially the feedback control loop transient optical power suppressor 200 as shown. Except for the loop feedback controller 270, all of the elements shown therein have been fully explained above with reference to FIG. 1. Further details of the loop controller 270 and its operation are explained below with reference to FIG. 4b. It is important to realize that the feedback control loop embodiment may operate independently and does not necessarily require the feedforward control loop additional elements shown in FIG. 1. In other words, the feedback control loop transient optical power suppressor 200 represents a distinct embodiment of the invention.

Figure 3:
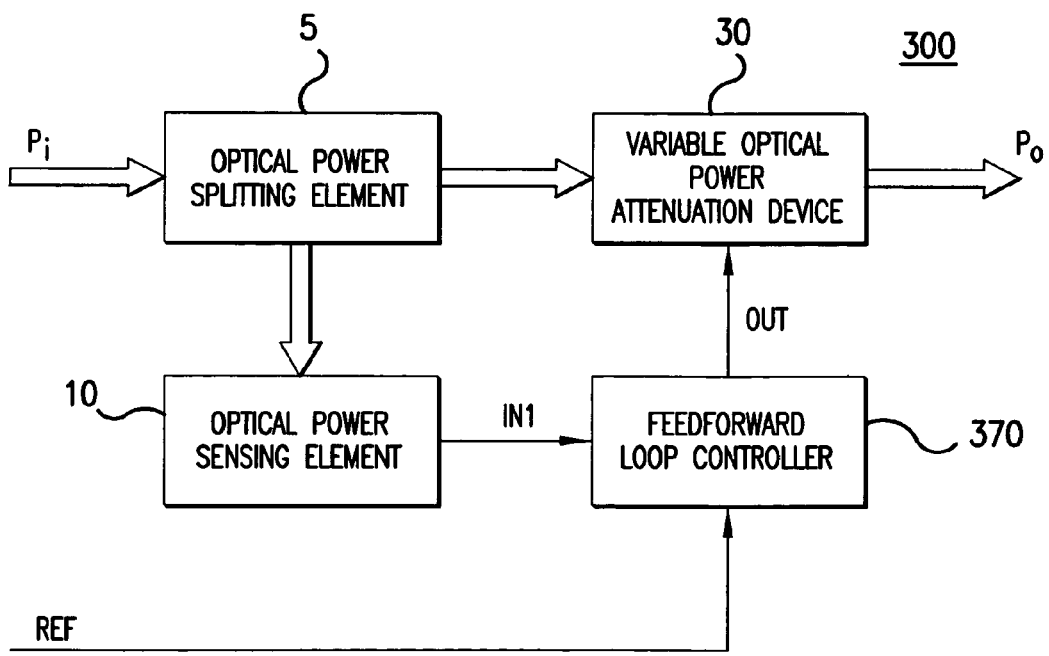
FIG. 3 is a high level block diagram of yet another transient optical power suppressor according to a third embodiment of the invention and including a feedforward control loop.

FIG. 3 is the feedforward control loop 300 embodiment of the invention and also acts as a transient optical power suppressor. Again, most of the elements shown in FIG. 3 have also been described above with reference to FIG. 1. Like reference numerals indicate like elements and a repeated description thereof is unnecessary here. The main difference is the feedforward loop controller 370 which does differ from the loop controller 70 of apparatus 100 shown in FIG. 1. Further details of the loop controller 370 and its operation will be explained below with reference to FIG. 4c.

FIG. 4a illustrates the components of loop controller 70 that may be utilized with the transient optical power suppressor 100 shown in FIG. 1. The loop controller 70, in general, utilizes the signals IN1, IN2 from the optical power sensing elements 10, 60 to derive a drive signal (out) for the variable optical power attenuation device 30. In more detail, the loop controller 70 includes amplifiers 70, 78 each of which may be a unity-gain buffer (gain=1) or may have multiple amplification stages with more or less complex frequency responses and gains such as the logarithmic amplifiers discussed in relation to FIG. 5 below. Furthermore, the amplifiers 72, 78 may be completely omitted from the loop controller 70. These amplifiers 72, 78 may be constructed with simple IC circuits typically referred to as operational amplifiers and are available form various manufacturers such as Texas Instruments or others.

The reference value (REF) may be a voltage or current signal that may be proportional to the desired optical output power level or optical attenuation. Generally speaking, optical attenuation is the ratio between $P_0$ and $P_i$ and can be smaller than one if the optical power attenuation device 30 can amplify the optical signal present at its input port.

It is also possible that the REF signal may be adjusted. Such adjustment may be accomplished via a simple potentiometer or may be supplied by an external device such as node controller, network controller, systems administrator, craft terminal, etc. If the REF signal is connected to a service channel or overlay network, it would also be possible to remotely designate or change the attenuation value to provide more dynamic control of the various embodiments of the invention.

The REF input to the loop controller 70 can take different forms depending on the particular implementation of the loop controller. In general, the range and scaling of REF will be similar to the range and scaling of the quantities that derived from the optical power signals and used by the loop controller 70.

For example, in an implementation where the optical power signals are converted to voltages and the loop controller 70 is an analog electronic circuit, REF could be a simple voltage generated for example with a potentiometer.

Another example would be a case where the controller is implemented using digital techniques (e.g. microprocessor). The optical power signals could be converted to digital numbers and REF would then become a simple number that the digitized power signals could be compared to.

The loop filter/processing element 75 and/or the loop controller 70 itself may be constructed utilizing various components such as analog circuits, digital circuits, or a combination of both. The overall purpose of the loop filter/processing element 75 is to improve the dynamic performance of the power/attenuation control loops (e.g., transient suppression efficiency and speed).

Figure 6A:
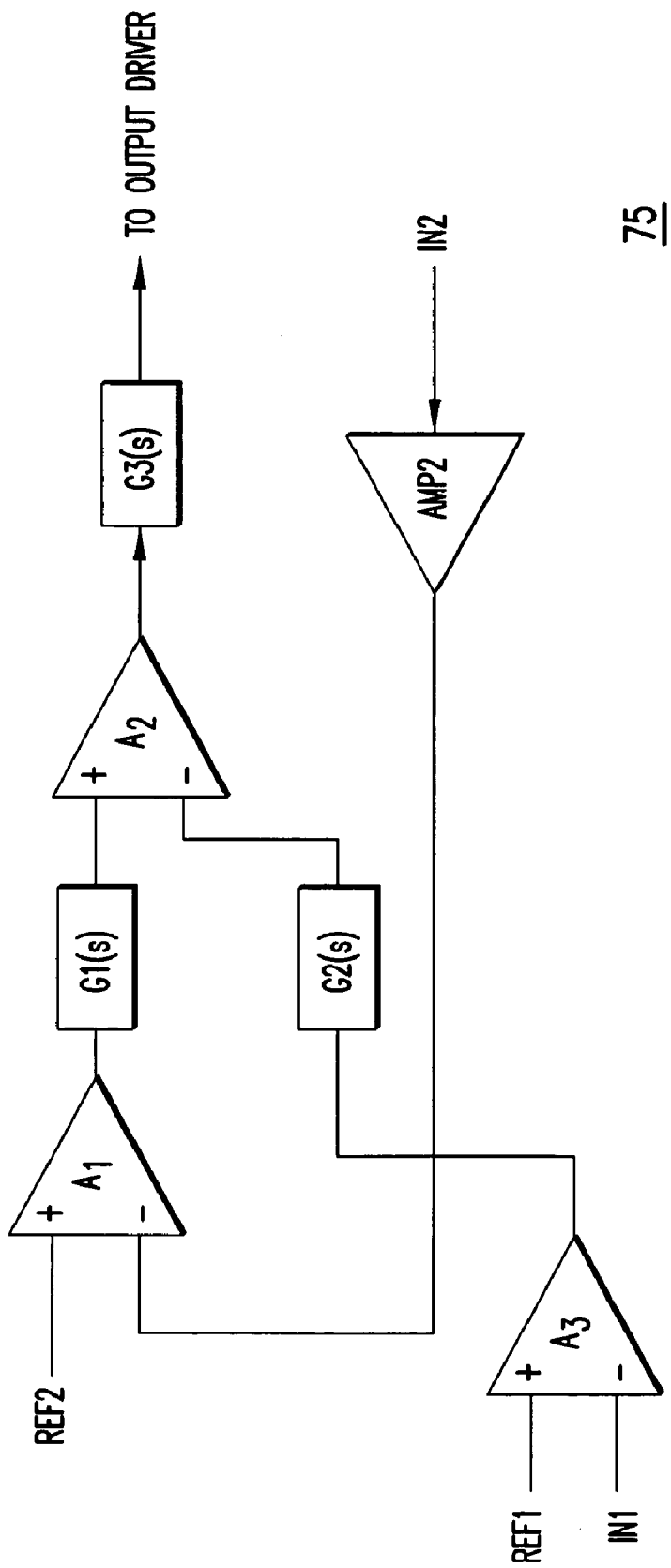
FIG. 6a is a diagram of an analog circuit that may be utilized to construct the loop filter according to the first embodiment of the invention.
Figure 6B:
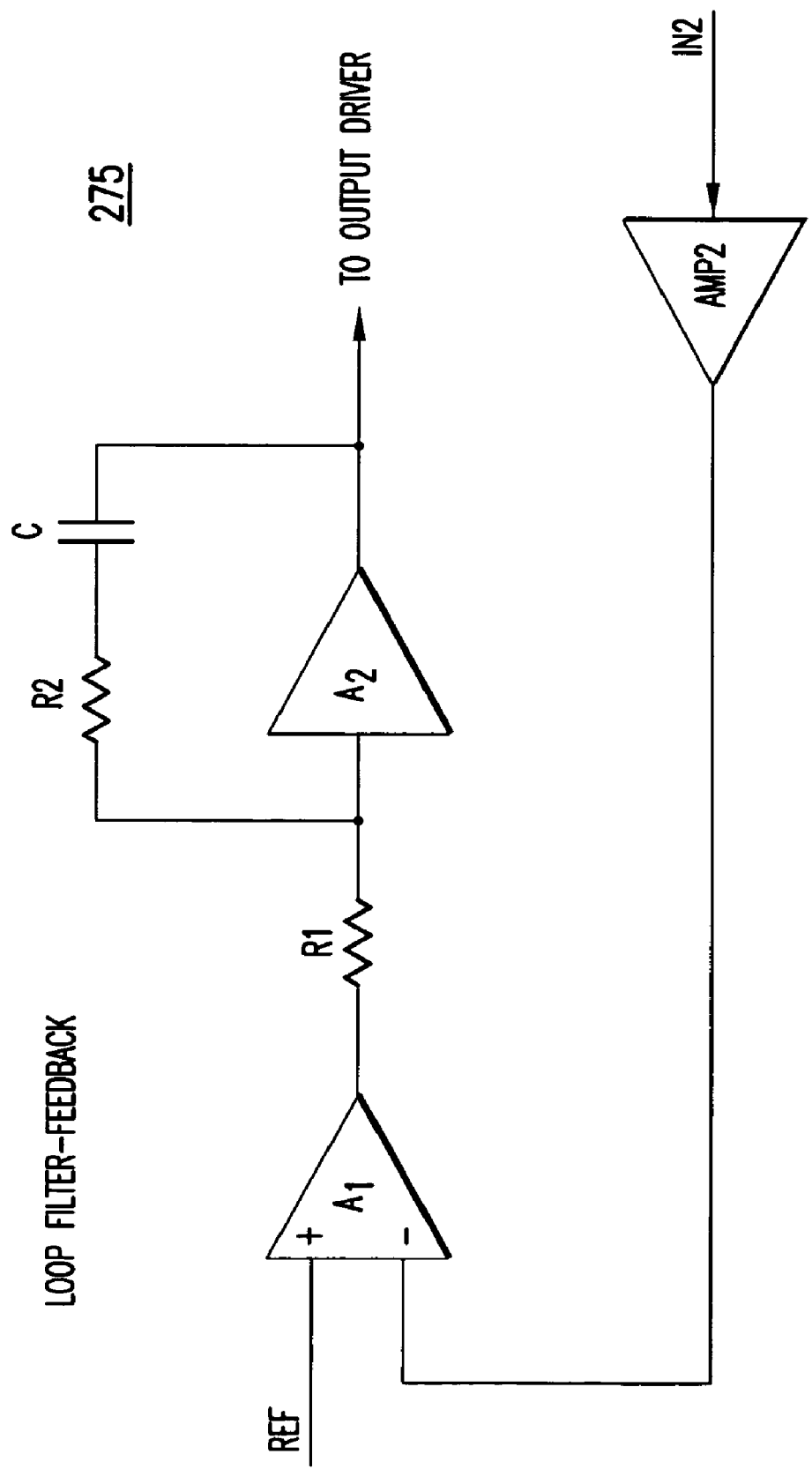
FIG. 6b is a diagram of an analog circuit that may be utilized to construct the loop filter according to the second embodiment of the invention.
Figure 6C:
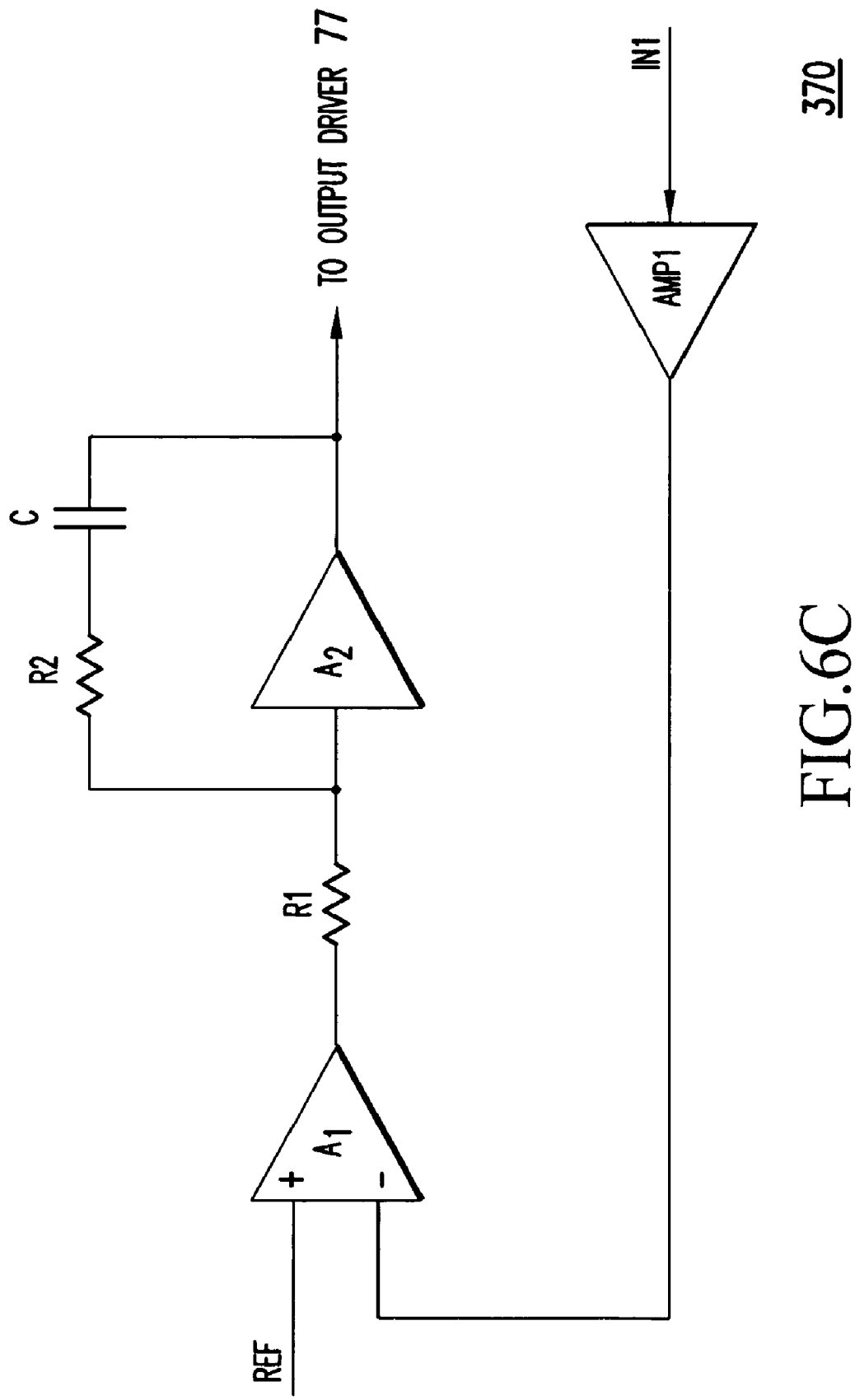
FIG. 6c is a diagram of an analog circuit that may be utilized to construct the loop filter according to the third embodiment of the invention.

Possible examples of loop filter/processing element 75 can range from simple analog R-C filters built around operational amplifiers, leading to proportional integrators or derivators (known as PI or PID controllers) such as that shown in FIG. 6a-c, to more complex microprocessor or digital signal architectures as generally known in the art.

Figure 6D:
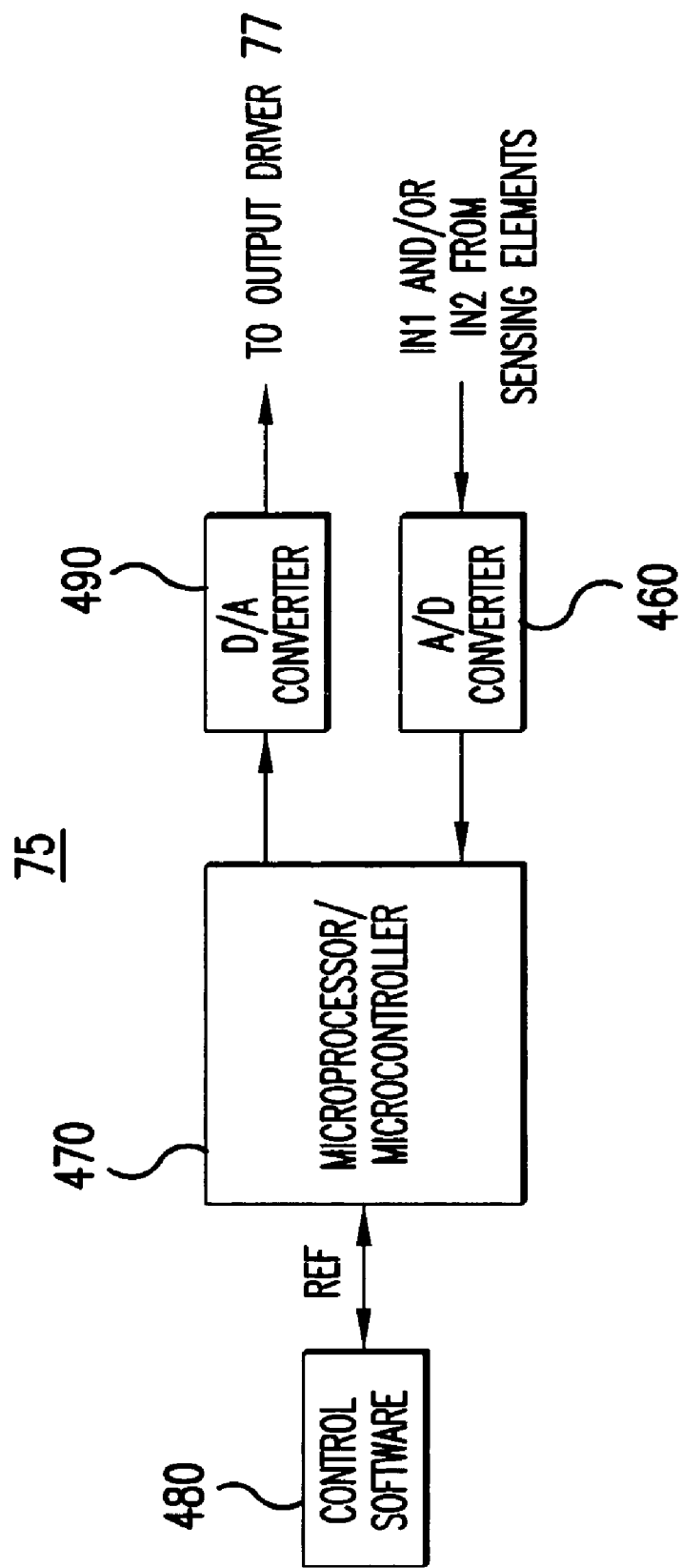
FIG. 6d is a diagram of a digital circuit that may be utilized to construct the loop filter according to any of the embodiments of the invention.

FIG. 6d shows one non-limiting example of a digital implementation of the loop filter/processing element 75 that also applies to the other loop filter/processing elements 175, 275 of the second and third embodiments.

As shown in FIG. 6d, the REF signal may be provided to a microprocessor or a microcontroller 470 via the control software 480, and could be, for example, an external user-supplied value or a value from a look-up table. This easily permits the REF signal to be programmable.

The A/D converter(s) 460 supply digital versions of the analog power measurements IN1 and/or IN2 (depending upon which embodiment, different power values are input) and may be omitted if the power values are provided in a digital format.

The microprocessor/microcontroller 470 uses the digital values from the A/D converters 460 as input variables to the specific "filter equation" being implemented within the microprocessor/microcontroller programmed with the control software 480. In the digital world, this "filter equation" is the mathematical equivalent of the circuits illustrated in, for example, FIG. 6a, 6b, or 6c.

The D/A converter 490 takes the digital output from the microprocessor/microcontroller 470 and supplies it to the output driver 77; this element may also be omitted if the particular output driver may accept a digital input.

As an alternative to a microprocessor/microcontroller 470 and control software 480, an FPGA or some other ASIC could also be used to implement the loop filter equation and otherwise replace the microprocessor/microcontroller 470, as is well known in the art.

The design intent for which the loop filter/processor element 75 is mainly responsible is to suppress power transients utilizing an appropriate control signal that is supplied to the variable optical power attenuation device 30 in order to maintain a constant power level or at least substantially constant power level at the output. This may be done, in general, by finding the difference between the measured power and the reference value. This difference may be amplified and conditioned by the loop filter/processing element 75 in order to improve the control loop performance. In this way, the loop filter/processing element 75 supplies a control signal to the output driver 77.

The output driver 77 is responsible for converting the control signal from the loop filter/processing element 75 into an appropriate signal required by the particular variable optical power attenuation device 30 chosen for the implementation. In other words, the drive signal will vary depending on the particular technology, manufacturer, and other parameters of the particular variable optical attenuation device 30 chosen for the implementation.

The output driver 77 is used to transition from the control signals generated by the loop controller 75 to the drive signal required by the specific VOA 30 being used. For example, in a case where the VOA 30 is a voltage- or current-controlled device and the loop controller 75 is implemented as an analog electronic circuit, the output driver 77 could be a simple operational amplifier circuit to provide either the required voltage gain or transconductance gain.

In a case where the loop controller 70 is implemented using digital techniques (microprocessors, DSP, etc. . . . ) such as shown in FIG. 6d, the output driver 77 could be a D/A converter or a combination of a D/A converter and an amplifier. Such driving circuitry and its alternatives are conventional elements in and of themselves. FIG. 6a illustrates one construction of the loop filter/processing element 75 for the combination feedforward and feedback control loop embodiment of the invention. Further details of the operation thereof will be explained below with reference to FIG. 6a.

Figure 4B:
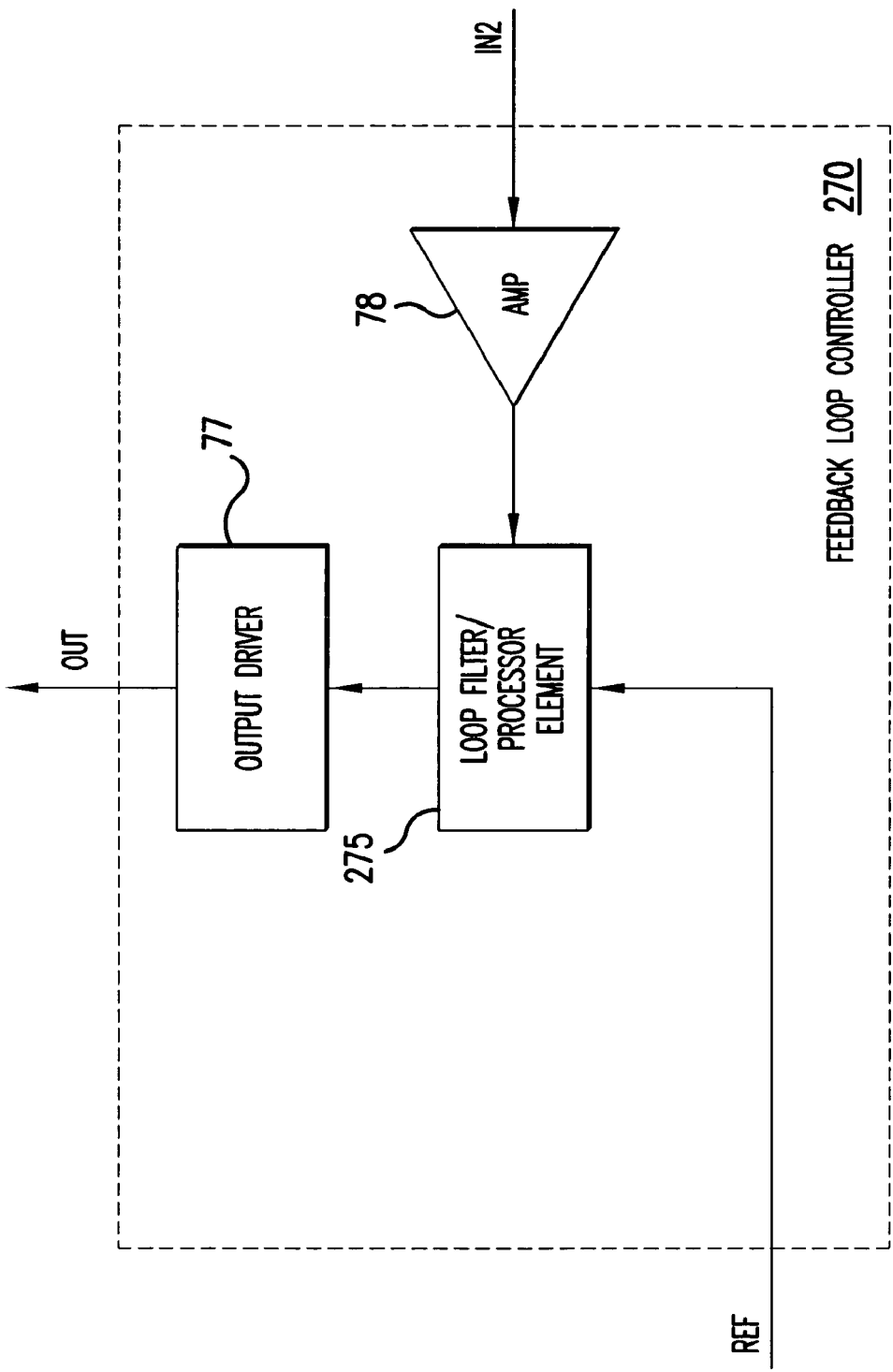
FIG. 4b is a block diagram illustrating a construction of another loop controller according to the invention and usable with the second embodiment of the invention.

FIG. 4b illustrates the loop controller 270 that may be utilized by the feedback control loop embodiment of FIG. 2. The loop controller 270 shares many components with the loop controller 70 as indicated by like reference numerals. Thus, a duplicative description will be omitted here. The main difference with respect to FIG. 1 is the loop filter/processor element 275. An example of a filter processor element 275 is shown in FIG. 6b with that figure representing but one example of how the circuit may be constructed utilizing analog components. Further details of the operation thereof will be provided below.

Figure 4C:
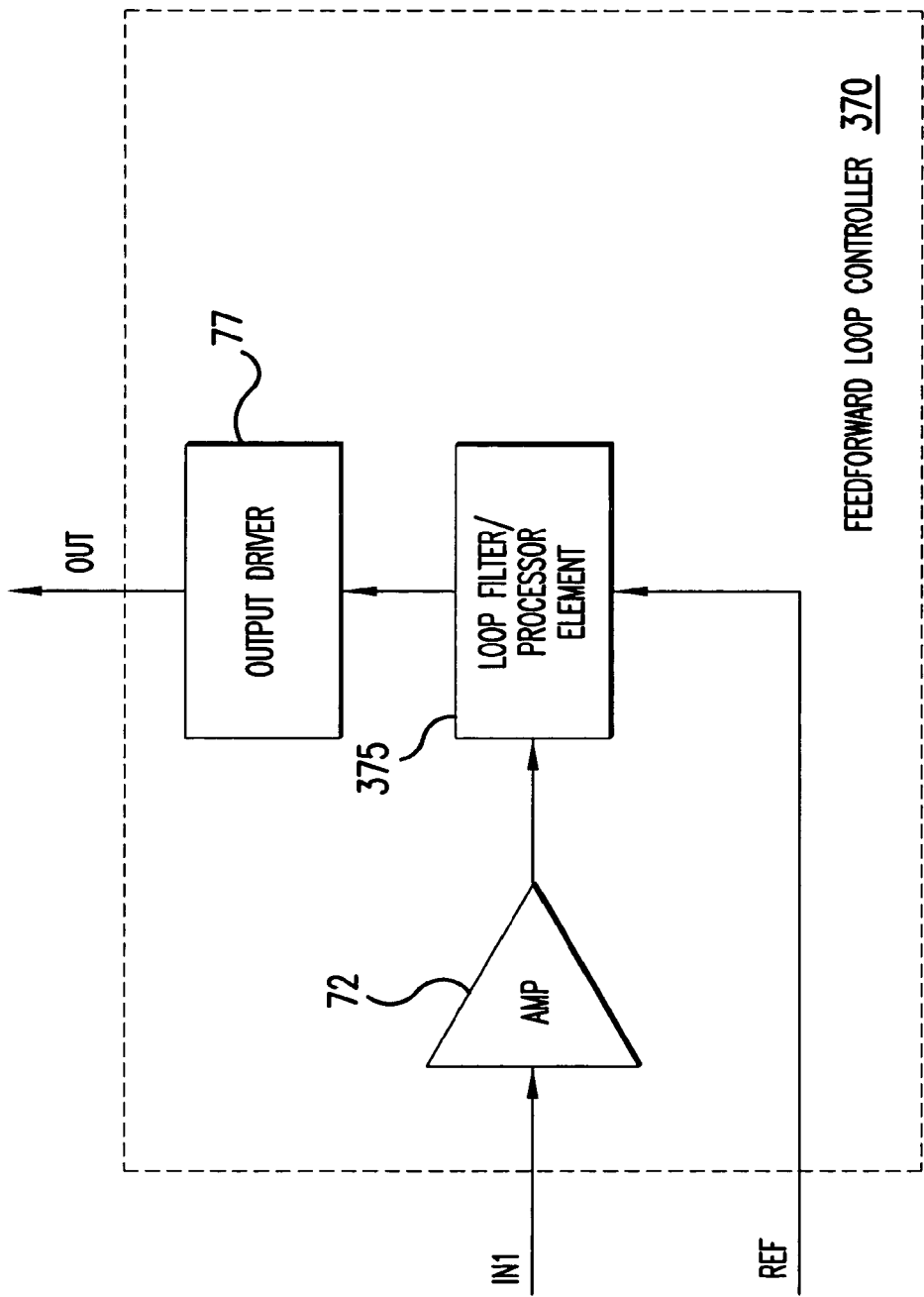
FIG. 4c is a block diagram illustrating a construction of yet another loop controller according to the invention and usable with the third embodiment of the invention.

FIG. 4c illustrates the feedforward loop controller 370 that may be used with the feedforward control loop embodiment of FIG. 3. Again, many elements are shared with the loop controller 70 of FIG. 4a. The main difference is the loop filter/processor element 375 a construction of which is explained below with reference to FIG. 6c.

FIG. 5 illustrates an alternative loop controller 170 that may be substituted for the loop controller 70 of the combined feedforward and feedback control loop embodiment of FIG. 1. The loop controller 170 mainly differs in the use of logarithmic amplifiers 172, 178 in place of the amplifier 72, 78 of FIG. 4a. The other main difference is the loop filter/processor element 175 which differs slightly from the loop filter/processing element 75 of FIG. 4a. The loop filter 175 will implement a different transfer function when log amps are used due to the differing gain range and output parameters as compared with linear amplifiers.

The use of a log amp in the loop controller is an important component to the preferred implementation and is preferably used in all three main embodiments. The function of the logamp is to convert an electrical input into an amplified output that varies logarithmically with the input. This allows a very large dynamic range of signal to be amplified, and avoids the requirement for switching the amplifier gain between different values (which causes a number of performance limitations).

The key performance requirements of the logamp for this application are speed, dynamic range, and accuracy. Recently several logamps have come onto the commercial market having significantly improved performance in these areas, particularly speed. Specific non-limiting examples for the logamps 172, 178 include:

Texas Instruments Logamp part number LOG114
Maxim logamp part number MAX4207
Burr-Brown part number OPA380

As explained below, the logarithmic amplifiers 172, 178 are generally preferred over the amplifier 72, 78 of the FIG. 4a embodiment. The reasoning is discussed below and also applies to the amp 78 used in the feedback loop controller 270 and the amp 72 used in the feedforward loop controller 370.

When modeling control loop for a VOA, an equation similar to the following one can often be used to approximate the relationship between the optical input power ($P_i$), the optical output power ($P_o$), and the VOA control signal (x):

$$10 \cdot \log(P_i/P_o) = K \cdot x$$

K, although most of the time a complex nonlinear transfer function, can be approximated by a constant in the vicinity of a specific operating point.

Assuming that $P_i$ is constant, the small-signal gain between the control signal x and the output power $P_o$ can be determined by taking the difference between the following equation and the following one:

$$10 \cdot \log(P_i/(P_o + \Delta P_o)) = K \cdot (x + \Delta x)$$

Replacing the logarithm by its linear approximation around $P_o$, one then gets $$\frac{\Delta P_o}{\Delta x} = -K' \cdot P_o,$$

where K' is equal to K·ln 10/10.

This last equation shows that in the vicinity of a control point $P_o$, the "gain" of the VOA 30 is dependent on the optical power level. In a closed-loop system, this means that the dynamics of the VOA control loop will be dependent on the specific operating point selected for the VOA, usually causing the loop to become very slow at low power levels, and presenting the risk of oscillation due to increased gain at higher power levels.

A logarithmic amplifier delivers an output signal, usually a voltage, that varies as the logarithm of the ratio between the input signal to the amplifier, usually a current, and some reference signal, also usually a current. Designating as $V_o$ the output of the logarithmic amplifier, $I_i$ the input signal, and $I_r$ the reference signal, this input-output relationship can be modeled as $$V_o = K_a \cdot \log(I_i/I_r),$$

where $K_a$ is a constant and represents the gain of the amplifier.

Using a similar approach to the one used above for the VOA 30, the small-signal relationship between the amplifier input and output signals can be written as $$\frac{\Delta V_o}{\Delta I_i} = \frac{K'_a}{I_i}.$$

Thus, the small-signal gain of the logarithmic amplifiers 72, 78 around a certain operating point $I_i$ is inversely proportional to the input current $I_i$. By making $I_i$ proportional to the optical power $P_o$. For example by using photodetector 60, one can eliminate the dependence of the loop gain on the optical power since the dependence in $P_o$ and $I_i$ in the equations above will cancel each other.

FIG. 6a shows the more complex case where both feedforward and feedback control loops are used. Instead of using specific filter examples, FIG. 6a expresses the filters in terms their Laplace transform nomenclatures. Typically G3(s) is equal to 1/G2(s) although in practice it is difficult to achieve specially for some frequency ranges. The feedforward filter loop will represent, therefore, some kind of derivative function, if proportional integral (PI) is used for the feedback control loop, the overall control loop can take the form of a PID controller. The precise definition of these transfer functions will greatly depend on the VOA technologies used and the parameters to optimize as is known in the art.

Note that the 2 reference levels for the combined feedforward/feedback control loop can be defined differently as REF1 refers to the optical power at the input of the device, while REF2 refers to power at the output of the device. The errors detected from both control loops are used to generate the proper drive signal to the VOA through G1(s), G2(s) and G3(s). A1 through A3 are differential amplifiers (and possibly gain elements) that provide at their output a possibly amplified signal that corresponds to the delta of their input. Amp2 is an amplifier, possibly a log amp that is used to amplify the signal coming from the sensor. Such an amplifier can also be used for IN1 but is optional.

FIG. 6b illustrates one alternative for constructing the loop filter/processing element 275 which applies in the feedback control loop. Essentially, the loop filter/processing element 275 may be constructed with a simple analog circuit as shown. The circuit includes a differential amplifier stage A1 which is utilized to compare the actual output optical power level (via IN2) to a desired output power level (via REF value) and a proportional-integral (PI) filter stage A2. The proportional-integral filter stage A2 includes an associated RC circuit including resistors R1, R2 and capacitor C connected as shown in FIG. 6b. The values of the components R1, R2, and C are selected and tuned to optimize the control loop performance and will depend upon various factors such as the specific VOA 30 selected for the implementation. The amp (Amp2) shown in FIG. 6b corresponds to either the logamp or other opamp implementations described above.

FIG. 6c illustrates one alternative for constructing the loop filter/processing element 375 which applies in the feedforward control loop. Essentially, the loop filter/processing element 375 may be constructed with a simple analog circuit as shown. The circuit includes a differential amplifier stage A1 which is utilized to compare the actual input optical power level (via IN1) to a desired output power level (via REF value) and a proportional-integral (PI) filter stage A2. The proportional-integral filter stage A2 includes an associated RC circuit including resistors R1, R2 and capacitor C connected as shown in FIG. 6b. The values of the components R1, R2, and C are selected and tuned to optimize the control loop performance and will depend upon various factors such as the specific VOA 30 selected for the implementation. The amp (Amp1) shown in FIG. 6c corresponds to either the logamp or other opamp implementations described above.

The simple analog filter illustrated in FIG. 6c here could be used in a situation where only feedforward control is desired. In that case the input power Pin is read and the VOA attenuation controlled such as to make sure that Pin—VOA—attenuation matches the target output power. So the output power is not controlled directly but derived from the reading of the input power through the sensing element 10 and converted to a current or voltage IN1. Ref in that case corresponds to the voltage required to maintain a specific VOA attenuation VOA attenuation such that Pin—VOA—attenuation corresponds to the desired output power.

The output from the differential amplifier is fed to the proportional-integral (PI) filter stage. The values of the components R1, R2, and C are selected and tuned to optimize the control loop performance and will depend mainly on the specific VOA selected for the application.

A feedforward implementation is suitable for example when the output power would be too small after the VOA attenuation to get sufficient accuracy in the control, as it would be the case in a feedback control mechanism.

It is noted that the various embodiments of the invention are not limited to the specific control themes specifically described above or illustrated in the drawings. Each of the control loops (feedback, feedforward and the combination of feedback and feedforward) may use a variety of control schemes such as proportional (P), proportional-integral (PI) or proportional-integral-derivative (PID). As is also understood in the art, feedforward control schemes generally prefer PID or at least a control scheme including a derivative component.

VOA Default Opaque State

It is generally preferred to set the default state of the variable optical power attenuation device 30 to be an "opaque" state. In other words, in all of the above embodiments, the optical power attenuation device 30 or VOA should be manufactured or set such that it has a maximum attenuation (opaque) in the default or power-off state. Further details follow.

The default state of a VOA device is typically defined to be either transparent (maximum transmission) or opaque (maximum attenuation). The default state will occur if the VOA devise loses electrical power due to equipment failure or some other cause. Optical transmission system architectures vary in structure, and different optimum default states are preferable for different types of systems. Point-to-point transmission links may have little need for a particular default state if the signals pass through optical amplifiers that will go dark anyway if power is lost at the node location, or the requirement may be default transparent if the rest of the node is designed to pass through the traffic if at all possible when power is lost.

Dynamic optical transmission systems having numerous added and dropped channels benefit significantly if the VOA 30 becomes opaque if control (or power) is lost. One reason is to prevent duplication of a wavelength channel. VOA 30 may be used to squelch a particular wavelength that is reused downstream in the network. If the VOA 30 loses power for any reason and becomes transparent, the unwanted signal that was intended to be squelched could prevent the intended channel from being transmitted successfully.

Another reason for a default opaque state for VOA 30 is fault isolation and signaling. The ability of a transmission network to respond to failures of many types is a critical performance factor. If power is lost at a node, or if a failure on a PCB (printed circuit board) causes a VOA or other device to revert to its default state, it is in many cases advantageous to squelch the unreliable signal and allow conventional LOS (loss of signal) detection equipment within the network to either reroute traffic or to initiate signaling and alarms that will indicate the problem as quickly as possible.

Mid-Range Bias of VOA 30

The loop controller 70 and its alternatives 170 and 270 preferably bias the variable optical power attenuation device 30 such that it is in its mid-range or at least substantially close to a mid-range bias. This may be accomplished via the loop filter/processing element 75 or its alternatives 175 or 275. Alternatively, this can be accomplished via the output driver 77 applying appropriate DC bias levels to the VOA 30 control signal. The rationale for this mid-range biasing and the advantages achieved thereby are further explained below with reference to FIG. 12.

Figure 12:
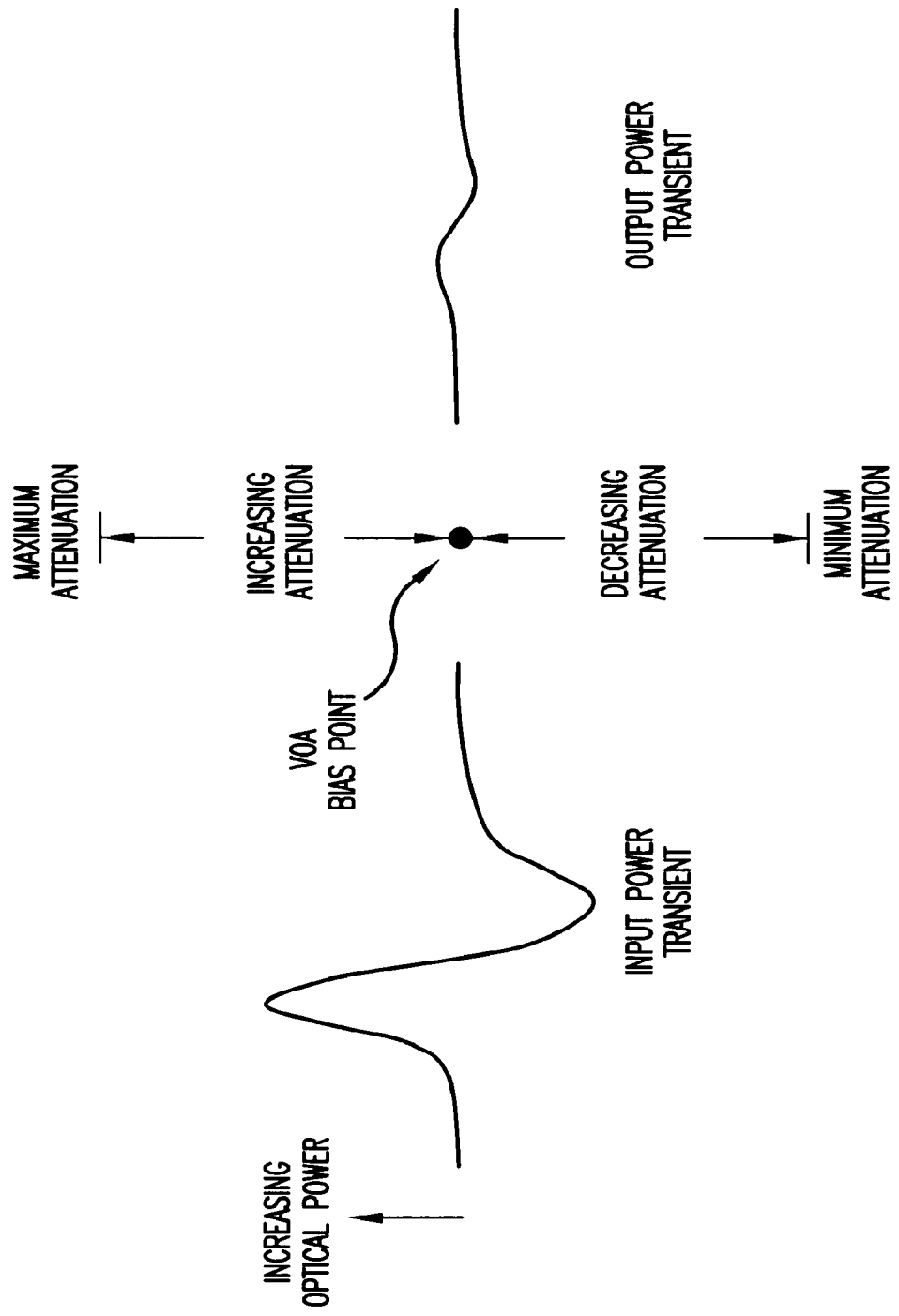
FIG. 12 is a signal diagram illustrating a preferred operation of the invention for compensating both positive and negative optical power transients and the advantageous application of mid-range biasing for the variable optical attenuator.

Generally speaking, optical power transients may be designated as positive transients that cause a sudden increase of the of the optical power level in a network or optical signal and as negative transients that cause a sudden decrease in the optical power. FIG. 12 illustrates the positive and negative transient designation as well as the invention's compensation for such positive and negative transients.

Although a VOA is often perceived as an element in an optical network that can only attenuate, or reduce, optical power it can be used to both increase or decrease the power level in an optical network if its steady-state operating point (attenuation level) is somewhere in the middle of its dynamic range. The VOA driver circuit 77, for example, can then increase or decrease the attenuation to compensate for either positive or negative power transients under the control of the loop controller such as controllers 70, 170 and 270. The compensation range in either direction will depend on the specific steady-state operating point selected and also on the total attenuation range of the VOA. FIG. 12 illustrates the concept of VOA mid-range biasing.

Even if steady-state operation of the VOA 30 above its minimum attenuation level may be perceived as causing extra loss in a network, it is very often possible and even desirable to incur the extra loss and adjust optical power to lower levels in order to optimize performance of the network. A good example of this is in reducing the optical power on a receiver in order to prevent saturation and improve tolerance to power variations.

The circuits of FIGS. 6a-d is illustrative only and are not meant to limit the invention in any fashion. Indeed, various other analog circuits could be utilized to include proportional control, PID (proportional integral derivative control) or various other standard control schemes as are known in the art. Furthermore, the invention is not limited to analog implementation such as those shown in FIGS. 6a-c. Indeed, the control may be represented as an equation and implemented via software and/or hardware microprocessor circuitry as is also known in the art.

Operation of Invention

Generally speaking, the various embodiments of the invention operate to reduce or otherwise suppress optical power transients in an optical signal. This may be accomplished utilizing the combined feedforward and feedback control loop embodiment illustrated in FIG. 1, the feedback control embodiment 200 shown in FIG. 2 or the feedforward control of embodiment 300 shown in FIG. 3. There are several variations for the components of these embodiments as described above. In general, all of them generally operate by applying one or more control loops sampling the input and/or output optical power values and supplying them to a loop controller. The loop controller controls the variable optical attenuator 30 to reduce optical power transients and maintain a substantially constant output power based on the power measurements. The feedforward control loop provides this control based on the input optical power measurement and a reference value. Likewise, the feedback control loop provides this control based on the output optical power measured by the optical output power sensing element and a reference value.

The operations of the feedforward and feedback may be combined to provide a comprehensive control based on both input and output power measurements supplied by the optical power sensing elements 10, 60. Generally speaking, this control is effected by comparing a measured power against a reference value and this difference may be calculated via analog circuitry such as the differential amplifier shown in FIG. 6a or via microprocessor for software based implementations that apply equations. Additional levels of detail in the control equations, particularly when using a logarithmic amplifier such as the embodiment of loop controller 170 shown in FIG. 5 are referenced above. The result of the control loop is a control signal supplied to the variable optical power attenuation device 30 such that it may respond to sensed optical power transients and thereby keep the output power substantially constant.

Because optical power transients may be extremely fast in short lived events, it is very important that the invention respond as quickly as possible to suppress the transient and prevent it from being sent to downstream optical elements.

The speed of the control loop is limited by 3 separate factors. First, the VOA 30 speed is dependent on the technology chosen. VOA response times vary from several seconds to sub-microsecond. In the latter case, the output driver 77 circuitry may be a limiting factor. Second, the bandwidth of the detection circuit including sensors 10, 60 used to provide the feedback is important. Here the amplification scheme may limit the overall frequency response. Third, the loop filter (75, 175, 275) and differential amplifier should be chosen to maximize the overall response speed.

The dynamic range of the control loop is determined largely by the VOA 30 dynamic range. For positive power transients, the dynamic range available below the operating setpoint will limit the amplitude of transients that can be suppressed. In order to suppress negative optical transients, the VOA 30 setpoint must be adjusted to an attenuation that is large enough to accommodate the negative amplitudes. In this case the VOA setpoint adds to the span loss in the transmission system or loss of demultiplexing elements after an optical amplifier and could limit the flexibility of system design. In the case the VOA is part of the line, like when the VOA is placed between 2 line amplifiers, the advantages of suppression of negative transients must be balanced against the disadvantages of reduced link budgets.

Simulated and experimental data of the inventive operation was also gathered thereby proving the advantages of the invention. Specifically, the feedback control loop embodiment of FIG. 2 was utilized for the analysis. The optical power sensing element 60 was simulated as a PIN diode and the VOA 30 was constructed with a current-injection VOA type. For the amplifiers and the loop controller, logarithmic amplifiers were utilized. For the loop controller 270 and specifically the loop filter/processing element 275, the following factors were taken into consideration.

Figure 13:
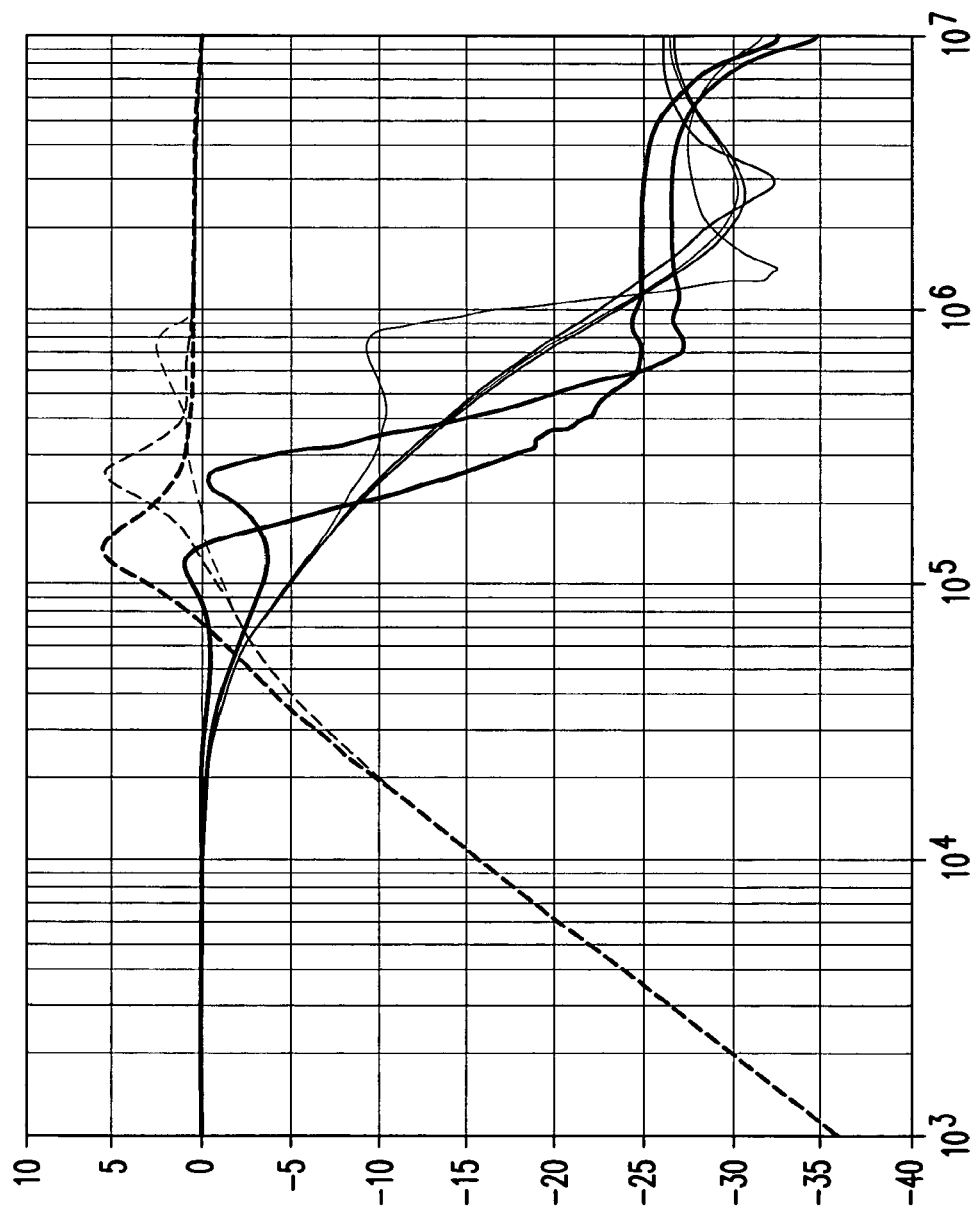
FIG. 13 is a simulated frequency response for different input powers showing the simulated performance of the invention and further illustrating the inventive advantages.

The frequency responses of the VOA 30 and its drive circuit 77 were measured independently and used to model the overall frequency response of the control loop. This simulation also incorporated frequency response data for the PIN, logarithmic amplifier, and comparator A1. Simulation results for the control loop are shown in FIG. 13. The figure includes two families of curves: the solid lines represent the ability of the control loop to follow variations to the reference voltage $V_r$, and the dashed lines represent the ability of the Control Loop to reject variations of the input optical power. This second characteristic determines the overall effectiveness of the transient suppression, and in this implementation the frequency response was limited to roughly $10^5$ Hz. The limitation is principally the result of the relatively poor frequency response of the logarithmic amplifier used to convert the output PIN current to $V_o$.

Figure 14:
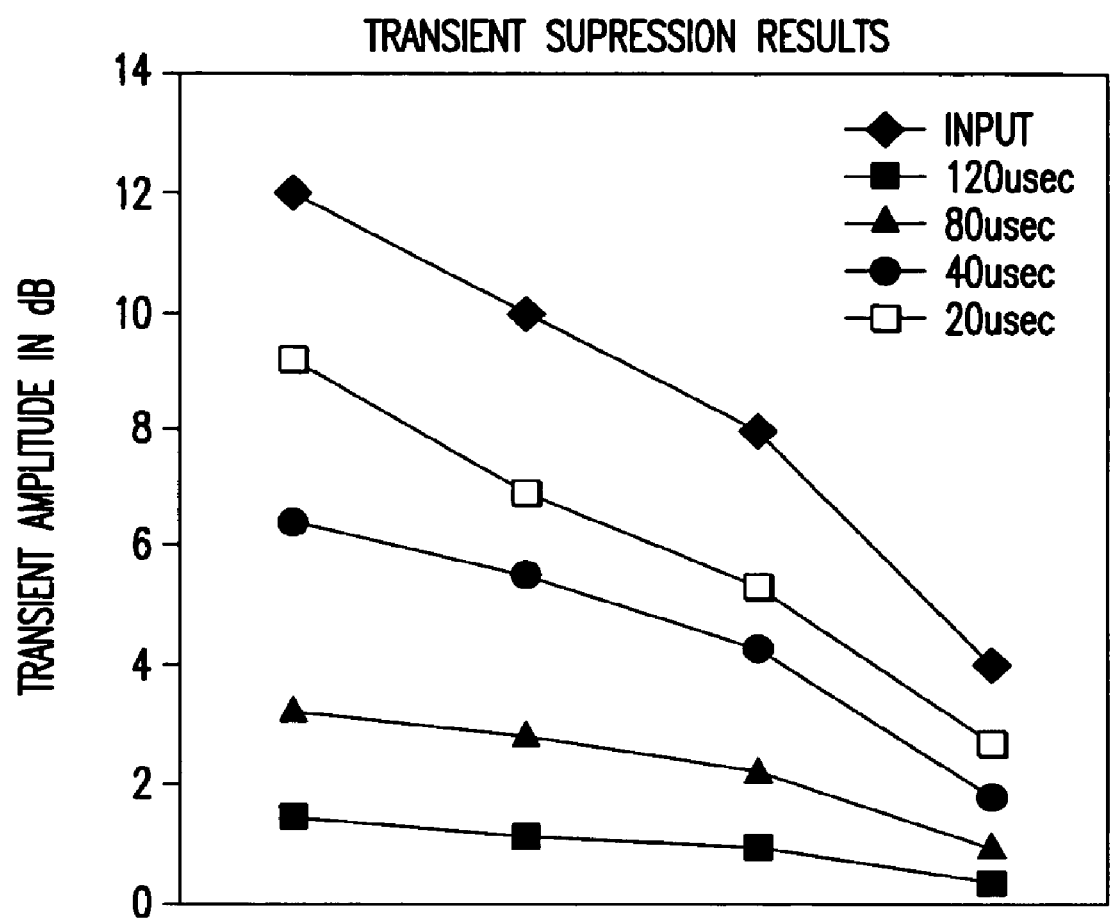
FIG. 14 is a graph of transient amplitude versus transient suppression results and further illustrating experimental results of the invention.
Figure 15:
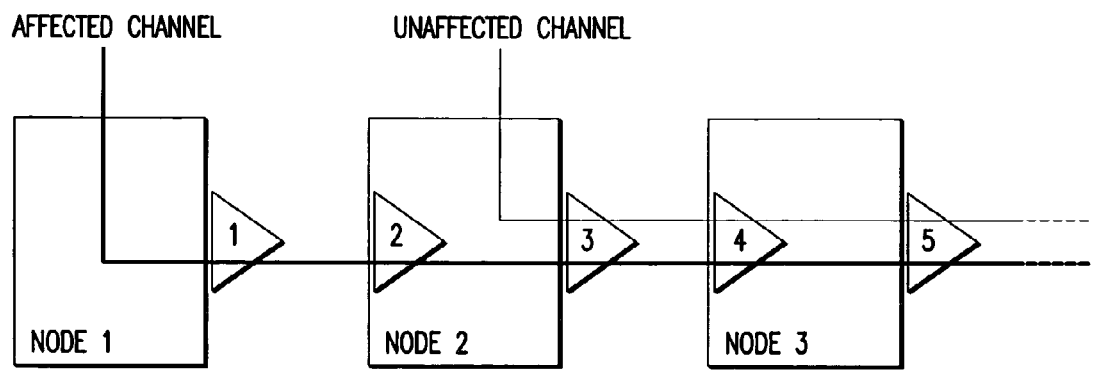
FIG. 15 is a high level simplified block diagram of a conventional optical network having several nodes and two channels and further illustrating how a fiber cut may lead to optical power transients.
Figure 16:
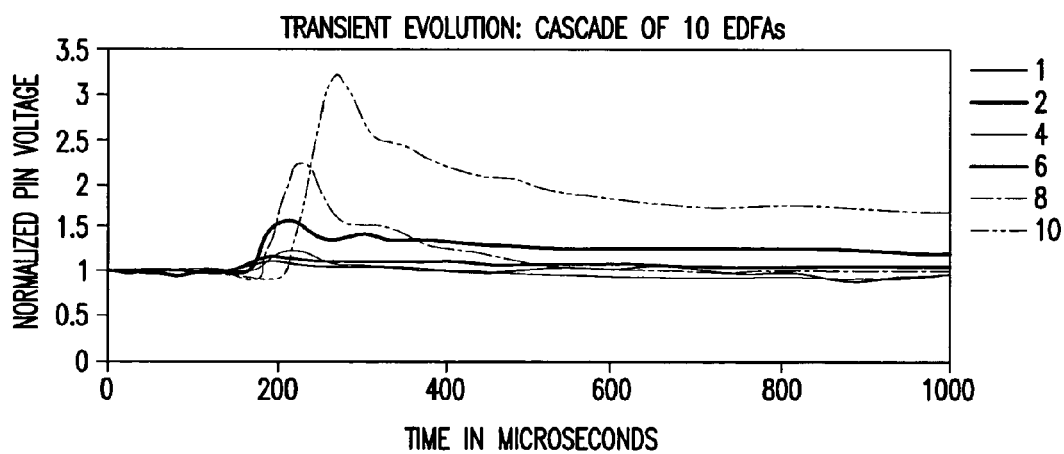
FIG. 16 is a graph illustrating the response of the conventional network of FIG. 15 to transients, particularly when a cascade of amplifiers is present.

FIG. 14 shows the experimental results for a positive Gaussian transient. As shown therein, the results are extremely promising and do show and exhibit the inventive advantages of suppressing optical power transients. The various curves represent different speed or timescale for the input optical power transient.

APPLICATIONS OF THE INVENTIVE EMBODIMENTS

The various inventive embodiments may be applied in a wide variety of situations. Generally speaking, there are certain locations in convention optical networks that would greatly benefit from the application of the invention. Two basic locations are illustrated in FIGS. 7a and 7b.

Figure 7A:
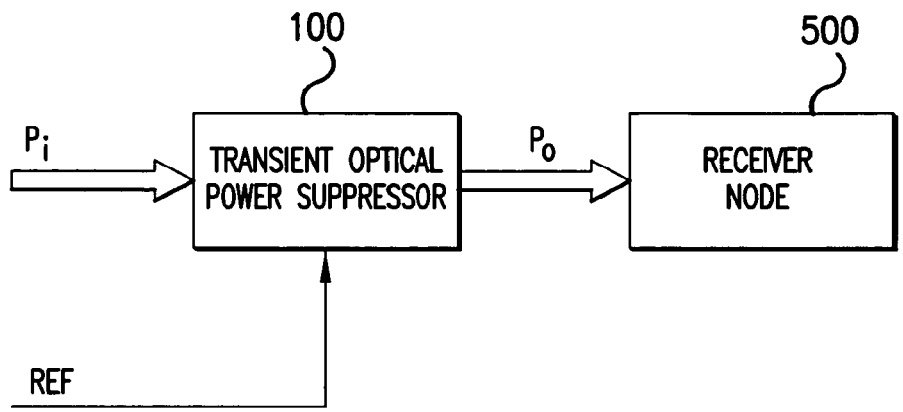
FIG. 7a is a high-level block diagram illustrating the application of the inventive transient optical power suppressor towards protecting and enhancing the functionality of a receiver network element.

As shown in FIG. 7a, the transient optical power suppressor 100 may be provided just prior to a receiver node 500. Such receiver nodes or network components are highly conventional elements in and of themselves and typically include such components as a photodetector to detect the optical signal and perhaps some timing and error correction circuitry. The actual implementation of receiver node 500 is irrelevant to the invention. The point is that receiver nodes 500 may become damaged by optical power transients. Optical power transients can also affect the performance of network elements such as the receiver node 500 and providing the invention at a network location prior to the receiver node 500 has distinct advantages.

Figure 7B:
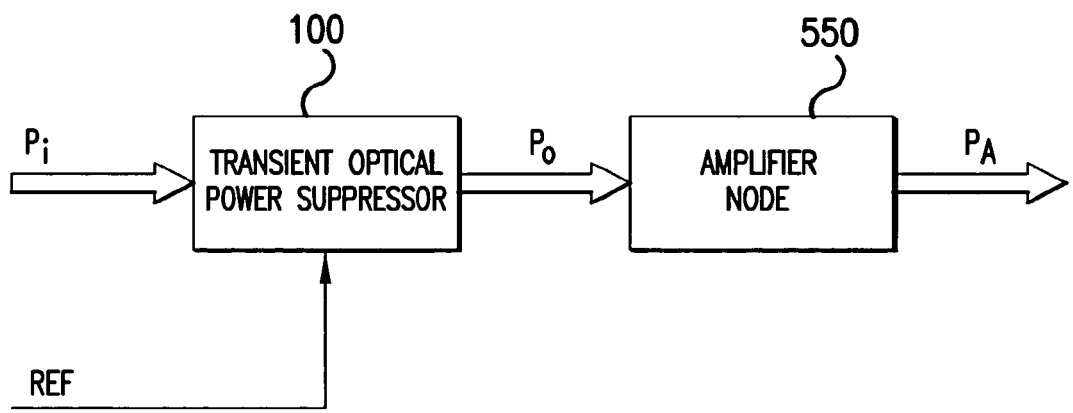
FIG. 7b is a high-level block diagram illustrating the application of the inventive optical power suppressor towards protecting and enhancing the functionality of an amplifier network element.

FIG. 7b shows another typical application of the transient optical power suppressor 100 according to the invention. In this case, the transient optical power suppressor 100 is provided just before an amplifier node 550. Such amplifier nodes 550 are conventional elements in and of themselves and may include any wide variety of amplifying components. Most typically in the WDM network, the amplifier node is an EDFA (Erbium doped fiber amplifier) but of course a wide variety of other optical amplification techniques and components may be utilized.

Other more detailed examples of network locations that would benefit by application and the invention are described below in relation to FIG. 8-11.

Figure 8:
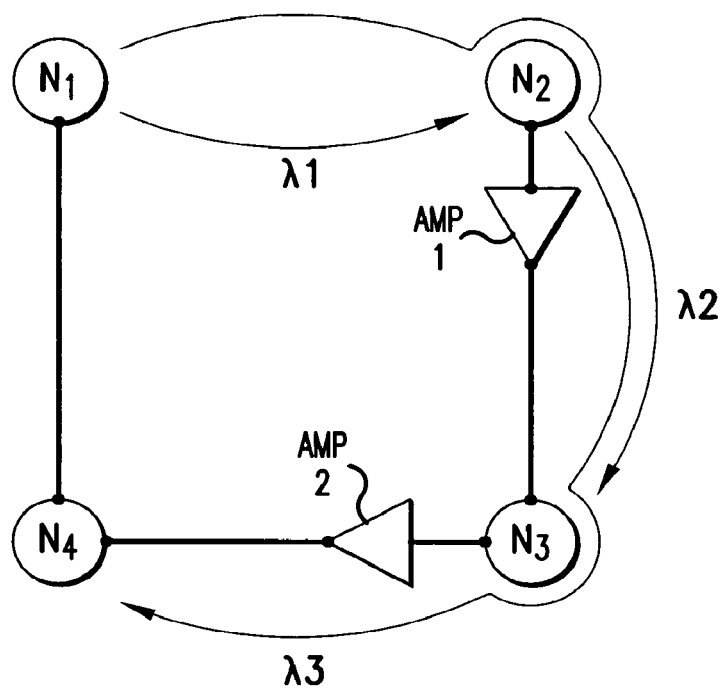
FIG. 8 illustrates a conventional ring-shaped optical network topology useful for illustrating how optical power transients arise in multi-wavelength networks.
Figure 11:
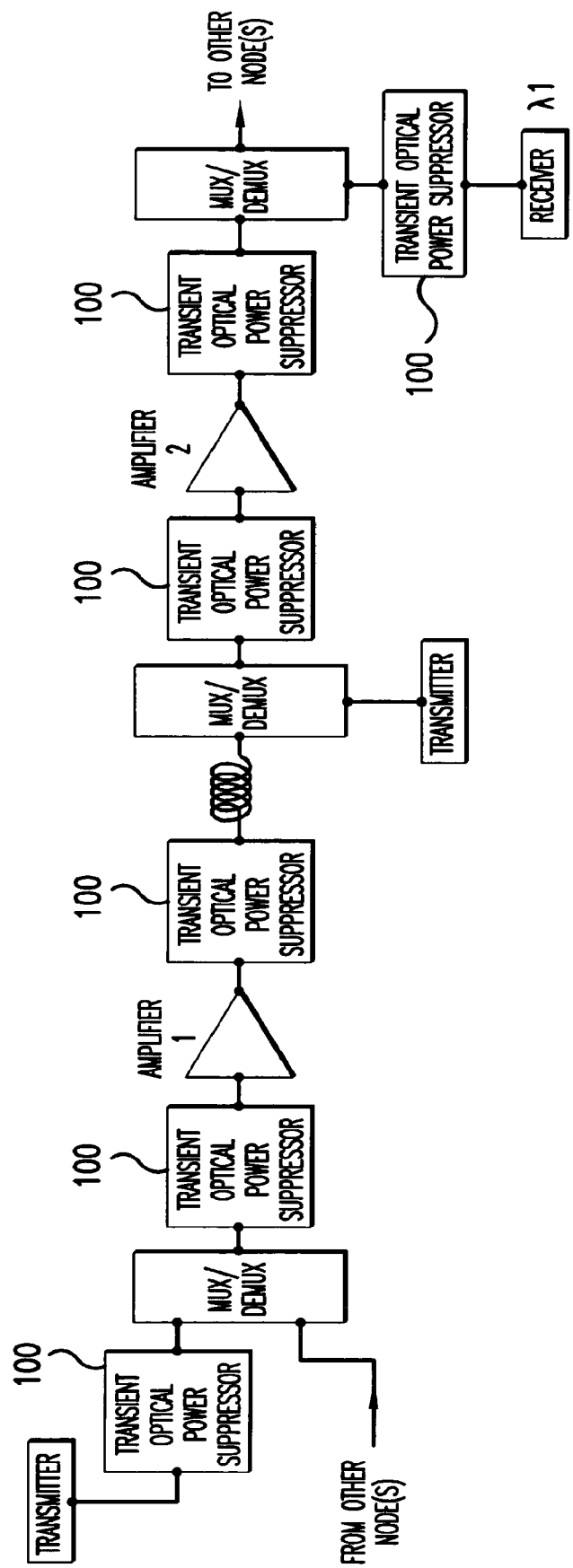
FIG. 11 illustrates the various applications of the transient optical power suppressor according to the invention to an otherwise conventional optical network and further illustrating various possible locations and applications to such a network.

FIG. 8 shows a ring-shaped optical network with 4 nodes, labeled N1 to N4. $\lambda 1$ to $\lambda 4$ represent a wavelength or a set of wavelengths used to transmit information between these nodes. A1 and A2 represent optical amplifiers. $\lambda 2$ is being transmitted from Node 1 (N1) to node 3 (N3). In doing so it goes through 1 amplifiers, A1. Say the fiber between N1 and N2 is cut. In that case the traffic $\lambda 1$ is being lost obviously, as well as the traffic $\lambda 2$. The traffic $\lambda 3$ should not be affected, however as the number of wavelengths going the amplifiers A1 is being changed, the power level of $\lambda 3$ will be experiencing variations (transients). The cause of these transients is that the amplifiers A1 can not instantaneously find a new inversion level that will accommodate the reduced power levels at its input. This will be true regardless of the amplifier being used in power control mode, or gain control mode, although the impact will be different in these 2 cases. Because this power fluctuation can cause error rates at the receivers, it is important to be able to correct these fluctuations with an optical device, in this case a fast Variable Optical Attenuator (VOA) 30 and attendant control loop(s) as disclosed herein. In FIG. 11 there is shown different possible placements for the VOAs.

Figure 9:
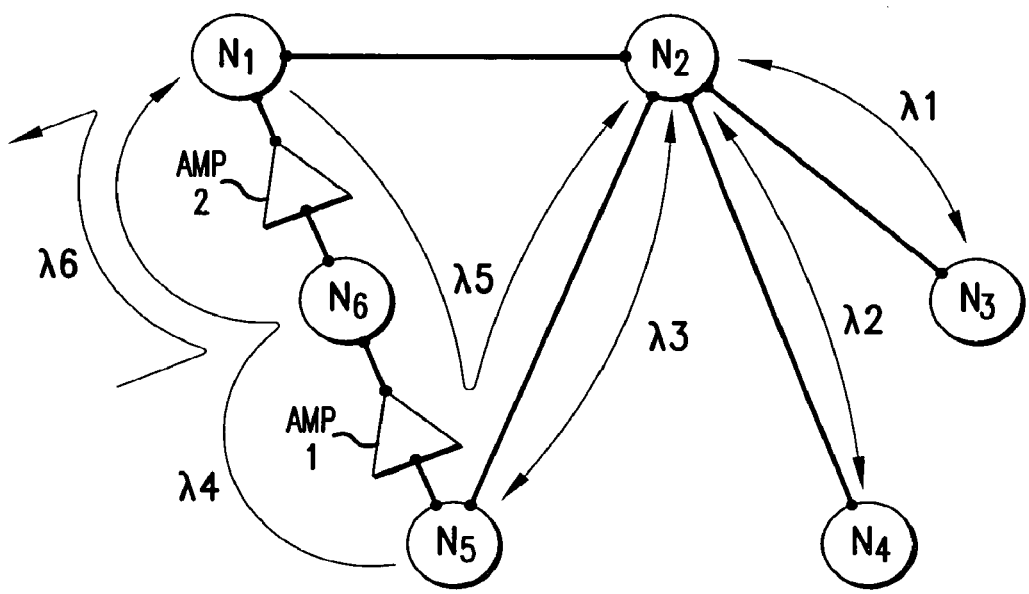
FIG. 9 illustrates a convention optical network having a mesh topology and further illustrating how optical power transients may arise in such networks.

FIG. 9 shows a mesh network with 6 nodes, labeled 1 to 6. $\lambda 1$ to $\lambda 6$ represent a wavelength or a set of wavelengths used to transmit information between these nodes. A1 and A2 represent optical amplifiers. As in FIG. 8, different traffic paths share some fiber segments. Say the fiber between N2 and N5 is being cut. The traffic $\lambda 3$ and $\lambda 5$ is being lost. $\lambda 4$ should not be affected, but because of the load change in the amplifiers A1 and A2, its optical power varies, requiring fast VOA for power control to minimize performance impact.

Figure 10:
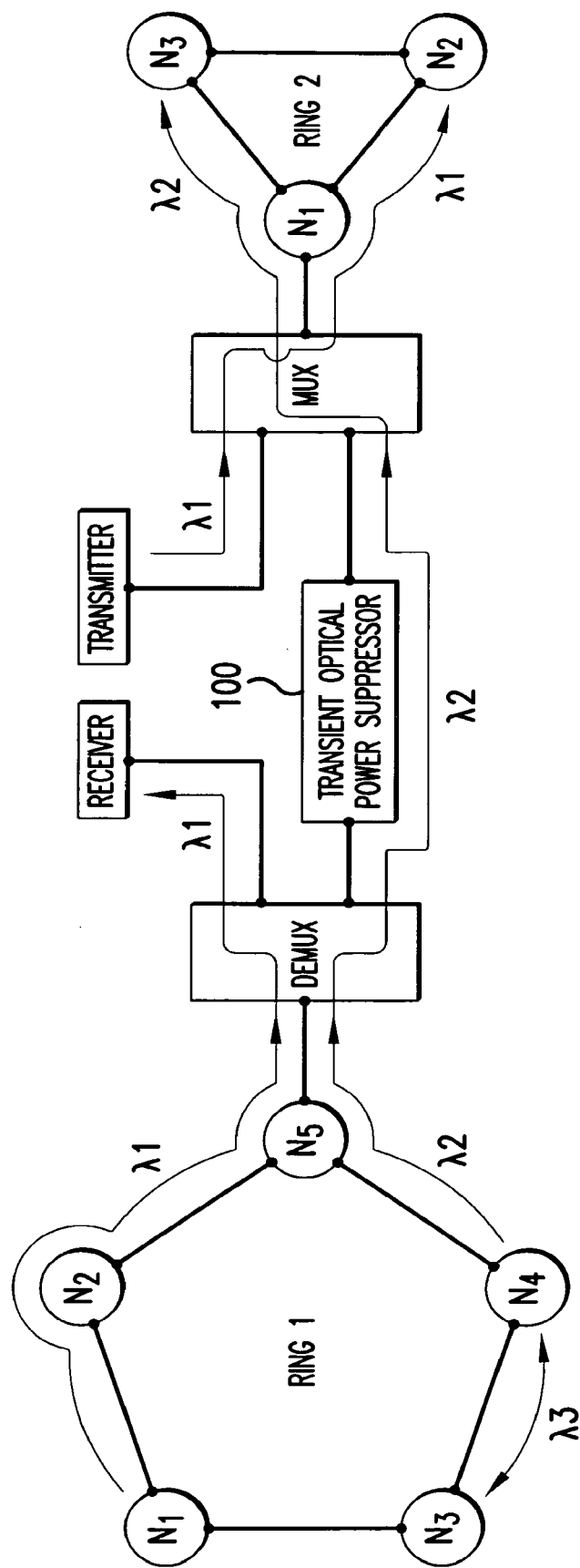
FIG. 10 illustrates the application of the inventive transient optical power suppressor to an optical network having two ring-shaped networks interconnected by an add/drop multiplexer.

FIG. 10 shows a ring (Ring 1) being connected to another ring (Ring 2). The traffic $\lambda 2$ is originating from N4 in Ring 1 and being dropped at N3 in Ring 2. To do this, it goes through N5 in Ring 1 and N1 in Ring 2. Note that N5 and N1 can be the same physical node. When multiple rings are connected together it becomes very important to isolate perturbations from one ring to another. I.e. any event that would cause power fluctuations in ring 1 must not affect the traffic in Ring 2. Also the number of rings connected together is not limited to 2. At any nodes, another ring can be connected and share that node.

It is important, in that specific example, to use the transient optical power suppressor 100 in between the Demux and Mux of N5 (Ring 1) and N1 (Ring 2). When multiple wavelengths are transmitted between the rings, and array of VOAs, the transient optical power suppressor 100, should be used, one per wavelength. The use of the transient optical power suppressor 100 will prevent power fluctuations to travel from one ring to another, simplifying network management, planning and system performance calculations.

FIG. 11 aims at showing in a typical application where the transient optical power suppressor can be used to control power fluctuations and transients. Note that the link showed here could be part of any topology described earlier, ring, mesh, ring-ring interconnect, etc. Various possible placements for the inventive transient optical power suppressor 100 are shown therein and further described below:

1: After a transmitter. When a laser fails, or the power supply in a specific shelf fails the light at the output of the laser can suddenly go down or up. The VOA transient power suppressor 100 is used to stabilize that power and avoid fast fluctuations to propagate down the link.

2: Before an amplifier. In that case one the transient power suppressor 100 is used to control the total power at the input of the amplifier. The goal is to limit fast power fluctuation at the input of the amp. This will allow to minimize the requirement of fast power or gain control loop inside the amplifier itself.

3: After an amplifier. For the same reasons as in P2, but this time placed after the amplifier.

4: Before a receiver. Finally the transient optical power suppressor 100 before a receiver and is used to control a single wavelength and maintain at the receiver as constant as possible the optical power level. Maintaining a fixed power level at the receiver is important for multiple reasons:

Surge up in power can cause bit errors and damage the receivers.

Surge down in power can cause bit errors or even sync loss

Although the first embodiment 100 of the invention is shown in FIGS. 7a, 7b, 10 and 11, it is to be understood that any of the inventive embodiments may be placed at the location indicated in these figures.

The invention being thus described, it will be obvious that the same may be varied in many ways. Such variations are not to be regarded as departure from the spirit and scope of the invention, and all such modifications as would be obvious to one skilled in the art are intended to be included within the scope of the following claims.

The invention claimed is:

1. An apparatus for suppressing optical power transients, comprising:
  a variable optical attenuator receiving an input optical signal and outputting an output optical signal;
  an optical power sensing element optically coupled to the input optical signal, said optical power sensing element sensing a portion of the input optical signal and outputting a signal indicative of input optical power of the input optical signal; and
  a feedforward loop controller operatively coupled to said variable optical attenuator and to said optical power sensing element;
  said feedforward control loop providing feedforward control of said variable optical attenuator to reduce optical power transients of the input optical signal and maintain a substantially constant output power based on the signal indicative of the input optical power and a reference value;
  said variable optical attenuator having a default opaque state in which the input optical signal is substantially attenuated when power is not being supplied to said variable optical attenuator; and
  said feedforward control loop providing control of said variable optical attenuator to reduce optical power transients and maintain a substantially constant output power based on the input optical power measured by said optical power sensing element and a reference value, wherein said reference value comprises a value proportional to one of a desired output power level and a desired optical attenuation, and wherein said reference value is adjustable by a user.

2. The apparatus according to claim 1, said variable optical attenuator being biased to a non-zero value in order to compensate for both positive and negative optical power transients.

3. The apparatus according to claim 1, said variable optical attenuator being mid-range biased to a value substantially in the middle of said variable optical attenuator's dynamic range in order to compensate for both positive and negative optical power transients.

4. The apparatus according to claim 1, wherein said variable optical attenuator is a current injection variable optical attenuator.

5. The apparatus according to claim 1, said feedforward loop controller including:
  a feedforward amplifier operatively connected to said optical power sensing element and inputting the signal indicative of input optical power of the input optical signal;
  a loop filter operatively connected to said feedforward amplifier and implementing a feedforward control scheme; and
  an output driver operatively connected to said loop filter and to said variable optical attenuator, said output driver driving said variable optical attenuator according to a control signal from said loop filter.

6. The apparatus according to claim 5, wherein said feedforward amplifier is a logarithmic amplifier.

7. The apparatus according to claim 5, said loop filter applying a P, PI or PID feedforward control scheme.

8. An optical network comprising:
  a plurality of network elements connected in a network configuration and carrying an optical signal having at least one channel; and
  an apparatus for suppressing optical power transients according to claim 1, said apparatus for suppressing optical transients being interposed between two of said network elements,
  wherein the network configuration is a linear, ring or mesh configuration.

9. The optical network according to claim 8, said apparatus for suppressing optical power transients being placed at a location selected from a group consisting of before an amplifier network element, after an amplifier network element, before a receiver network element, between a transmitter and multiplexer, before a multiplexer/demultiplexer network element, after a multiplexer/demultiplexer network element, and at an express path of an add/drop multiplexer network element.

* * * * *